(12) United States Patent
Lee

(10) Patent No.: US 11,925,081 B2
(45) Date of Patent: Mar. 5, 2024

(54) DISPLAY APPARATUS

(71) Applicant: Samsung Display Co., Ltd., Yongin-Si (KR)

(72) Inventor: Minsu Lee, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 385 days.

(21) Appl. No.: 17/401,476

(22) Filed: Aug. 13, 2021

(65) Prior Publication Data

US 2022/0238622 A1 Jul. 28, 2022

(30) Foreign Application Priority Data

Jan. 28, 2021 (KR) ........................ 10-2021-0012654

(51) Int. Cl.
*H10K 59/131* (2023.01)
*G09G 3/3225* (2016.01)
*H10K 59/121* (2023.01)
*H10K 59/126* (2023.01)

(52) U.S. Cl.
CPC ......... *H10K 59/131* (2023.02); *H10K 59/126* (2023.02)

(58) Field of Classification Search
CPC ............... H10K 59/126; H10K 59/131; H10K 59/1213; G09G 3/006; G09G 3/3233; G09G 3/3258; G09G 3/3283; G09G 3/3291

See application file for complete search history.

(56) References Cited

U.S. PATENT DOCUMENTS

| 2017/0287937 | A1* | 10/2017 | Ka ........................ H01L 27/1244 |
| 2017/0330928 | A1* | 11/2017 | Choi ..................... H01L 27/1255 |
| 2017/0358262 | A1* | 12/2017 | Moon .................... G09G 3/3233 |
| 2019/0148476 | A1* | 5/2019 | Park ....................... H10K 59/131 |
| | | | 257/40 |
| 2019/0267440 | A1* | 8/2019 | Park ....................... G09G 3/3291 |
| 2020/0235187 | A1* | 7/2020 | Bae ........................ H10K 59/124 |
| 2020/0243637 | A1 | 7/2020 | Lee et al. |
| 2020/0273928 | A1 | 8/2020 | Che et al. |
| 2020/0303479 | A1* | 9/2020 | Kim ...................... H01L 27/1248 |
| 2020/0312932 | A1 | 10/2020 | Kim et al. |
| 2021/0028258 | A1* | 1/2021 | Lee ........................ H10K 59/131 |

FOREIGN PATENT DOCUMENTS

| JP | 2019-105848 A | 6/2019 |
| KR | 10-2020-0094264 A | 8/2020 |
| KR | 10-2020-0115852 A | 10/2020 |

* cited by examiner

*Primary Examiner* — Mohsen Ahmadi
(74) *Attorney, Agent, or Firm* — Innovation Counsel LLP

(57) ABSTRACT

A display apparatus includes: a substrate including a display area and a peripheral area, the display area including a first display area, a second display area on one side of the first display area, and a third display area on another side of the first display area opposing the one side of the first display area; a driving voltage supply line in the peripheral area; a plurality of first driving voltage lines in the display area to be electrically connected to the driving voltage supply line; a driving voltage connection line surrounding the first display area. The driving voltage connection line includes a portion disposed in the peripheral area.

28 Claims, 14 Drawing Sheets

DISPLAY APPARATUS

CROSS-REFERENCE TO RELATED APPLICATION

This application is based on and claims priority under 35 U.S.C. § 119 to Korean Patent Application No. 10-2021-0012654, filed on Jan. 28, 2021, in the Korean Intellectual Property Office, the disclosure of which is incorporated by reference herein in its entirety.

BACKGROUND

1. Field

One or more embodiments relate to a display apparatus, and more particularly, to a display apparatus having a reduced dead space.

2. Description of the Related Art

Generally, in a display apparatus such as an organic light-emitting display apparatus, thin-film transistors are disposed in each pixel to control brightness, etc. of each pixel in a display area. The thin-film transistors are configured to control brightness, etc. of a pixel corresponding to a data signal transferred thereto. A data signal is transferred from a driver to pixels through a data line, wherein the driver is disposed in a peripheral area outside of a display area. In addition, thin-film transistors receive a driving voltage from a driving voltage supply line. Pixels receive a common voltage from a common voltage supply line.

SUMMARY

However, in a display apparatus according to the related art, the area of a dead space is large.

One or more embodiments include a display apparatus having a dead space with a reduced area. However, such a technical problem is an example, and the disclosure is not limited thereto.

Additional aspects will be set forth in part in the description which follows and, in part, will be apparent from the description, or may be learned by practice of the presented embodiments of the disclosure.

According to one or more embodiments, a display apparatus includes a substrate including a display area and a peripheral area disposed outside of the display area, the display area including a first display area, a second display area, and a third display area, the second display area being disposed on one side of the first display area, and the third display area being disposed on another side of the first display area which opposes the one side of the first display area, a driving voltage supply line in the peripheral area of the substrate, a plurality of first driving voltage lines disposed in the display area and electrically connected to the driving voltage supply line, a first driving voltage connection line disposed in the second display area of the substrate to cross each of the first driving voltage lines and extending into the peripheral area, a second driving voltage connection line disposed in the third display area of the substrate and extending into the peripheral area, and a third driving voltage connection line disposed in the peripheral area of the substrate and electrically connecting the first driving voltage connection line to the second driving voltage connection line.

The display apparatus may further include a fourth driving voltage connection line disposed in the peripheral area of the substrate to be symmetrical with the third driving voltage connection line with respect to a line of symmetry which passes through a center of the first display area along a first direction and electrically connecting the first driving voltage connection line to the second driving voltage connection line.

The display apparatus may further include second driving voltage lines disposed in the display area and electrically connected to the driving voltage supply line through the first driving voltage connection line and the plurality of first driving voltage lines.

The display apparatus may further include third driving voltage lines disposed in the display area to cross the second driving voltage connection line and electrically connected to the driving voltage supply line through the second driving voltage connection line, the third driving voltage connection line, the first driving voltage connection line, and the plurality of first driving voltage lines.

The plurality of first driving voltage lines and the plurality of second driving voltage lines may be symmetrical with the plurality of third driving voltage lines with respect to a line of symmetry which passes through a center of the first display area along a first direction.

The display apparatus may further include a first additional connection line disposed to be spaced apart from the first driving voltage connection line and disposed in the second display area of the substrate to cross each of the plurality of first driving voltage lines.

The display apparatus may further include a second additional connection line disposed to be spaced apart from the second driving voltage connection line and disposed in the third display area of the substrate to cross each of the plurality of third driving voltage lines.

The first additional connection line may be symmetrical with the second additional connection line with respect to a line of symmetry which passes through a center of the first display area along a second direction which is substantially perpendicular to the first direction.

The first driving voltage connection line, the second driving voltage connection line, the third driving voltage connection line, the plurality of first driving voltage lines, the first additional connection line, and the second additional connection line may be entirely formed as a single body.

The peripheral area may include a first peripheral area, a second peripheral area, and a third peripheral area, the first peripheral area being disposed on one side of the first to third display areas, the second peripheral area being disposed on another side of the first to third display areas, and the third peripheral area connecting the first peripheral area to the second peripheral area and being disposed outside of the second display area. The display apparatus may further include a first input line and a second input line disposed in the third peripheral area and disposed to be spaced apart from each other, a first data line extending from the third peripheral area into the display area and electrically connected to the first input line, a second data line extending from the third peripheral area into the display area, and a data connection line including one end electrically connected to the second data line in the third peripheral area and including the other end electrically connected to the second input line, the data connection line being disposed above or below the first data line to cross the first data line and to pass through the display area in a plan view.

The second data line may be disposed between the first data line and the first peripheral area.

The plurality of first driving voltage lines, the first driving voltage connection line, and the second driving voltage connection line may be disposed on a layer different from a layer on which the first data line and the second data line are disposed.

The first data line and the second data line may be disposed on a same layer.

The data connection line may be disposed on a layer different from a layer on which the plurality of first driving voltage lines, the first driving voltage connection line, and the second driving voltage connection line are disposed.

According to one or more embodiments, a display apparatus includes a substrate including a display area, a first peripheral area, a second peripheral area, and a third peripheral area, the first peripheral area being disposed on one side of the display area, the second peripheral area being disposed on another side of the display area which opposes the first peripheral area with the display area disposed between the first peripheral area and the second peripheral area, and the third peripheral area connecting one end of the first peripheral area to one end of the second peripheral area, a first common voltage supply line disposed in the first peripheral area, a second common voltage supply line disposed in the second peripheral area, a first third common voltage supply line and a second third common voltage supply line disposed in the third peripheral area and disposed to be spaced apart from each other, a first common voltage connection line electrically connecting an end portion of the first common voltage supply line to an end portion of the first third common voltage supply line, and a second common voltage connection line electrically connecting an end portion of the second common voltage supply line to an end portion of the second third common voltage supply line.

Each of the first common voltage connection line and the second common voltage connection line may have a portion overlapping the display area in a plan view.

The first to third common voltage supply lines may be disposed on a same layer.

The first common voltage connection line and the second common voltage connection line may be disposed below the first to third common voltage supply lines.

The display apparatus may further include a thin-film transistor disposed in the display area and including a semiconductor layer, wherein the first common voltage connection line and the second common voltage connection line may be disposed between the substrate and the semiconductor layer.

The display apparatus may further include a shield layer disposed between the substrate and the semiconductor layer to correspond to the thin-film transistor, wherein the first common voltage connection line and the second common voltage connection line may each include a same material as that of the shield layer.

The substrate may further include a fourth peripheral area connecting the other end of the first peripheral area to the other end of the second peripheral area, and the display apparatus may further include a fourth common voltage supply line disposed in the fourth peripheral area, a third common voltage connection line electrically connecting the other end portion of the first common voltage supply line to an end portion of the fourth common voltage supply line, and a fourth common voltage connection line electrically connecting the other end portion of the second common voltage supply line to the other end portion of the fourth common voltage supply line.

Each of the third common voltage connection line and the fourth common voltage connection line may have a portion overlapping the display area in a plan view.

The first to fourth common voltage connection lines may be disposed below the first to fourth common voltage supply lines.

The display apparatus may further include a thin-film transistor disposed in the display area and including a semiconductor layer, wherein the first to fourth common voltage connection lines may be disposed between the substrate and the semiconductor layer.

The display apparatus may further include a first intermediate connection layer disposed in the first peripheral area and overlapping at least a portion of the first common voltage supply line, a second intermediate connection layer disposed in the second peripheral area and overlapping at least a portion of the second common voltage supply line, a first third intermediate connection layer disposed in the third peripheral area and overlapping at least a portion of the first third common voltage supply line and a second third intermediate connection layer disposed in the third peripheral area and overlapping at least a portion of the second third common voltage supply line, and a fourth intermediate connection layer disposed in the fourth peripheral area and overlapping at least a portion of the fourth common voltage supply line.

The first intermediate connection layer may be electrically connected to the first common voltage supply line, the second intermediate connection layer may be electrically connected to the second common voltage supply line, the first third intermediate connection layer may be electrically connected to the first third common voltage supply line, the second third intermediate connection layer is electrically connected to the second third common voltage supply line, and the fourth intermediate connection layer may be electrically connected to the fourth common voltage supply line.

The display apparatus may further include a pixel electrode disposed in the display area, wherein each of the first to fourth intermediate connection layers may have a same layered-structure as a layered-structure of the pixel electrode.

The display apparatus may further include an intermediate connection layer that overlaps at least a portion of the first common voltage supply line in the first peripheral area, overlaps at least a portion of the second common voltage supply line in the second peripheral area, overlaps at least a portion of the third common voltage supply lines in the third peripheral area, and overlaps at least a portion of the fourth common voltage supply line in the fourth peripheral area.

The intermediate connection layer may have a first end and a second end, the first end being disposed on one side of the third peripheral area, the second end being on another side of the third peripheral area, and the intermediate connection layer may extend through the first peripheral area, the fourth peripheral area, and the second peripheral area.

The display apparatus may further include a pixel electrode disposed in the display area, wherein the intermediate connection layer may have a same layered structure as a layered structure of the pixel electrode.

These and/or other aspects will become apparent and more readily appreciated from the following description of the embodiments, the accompanying drawings, and claims.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
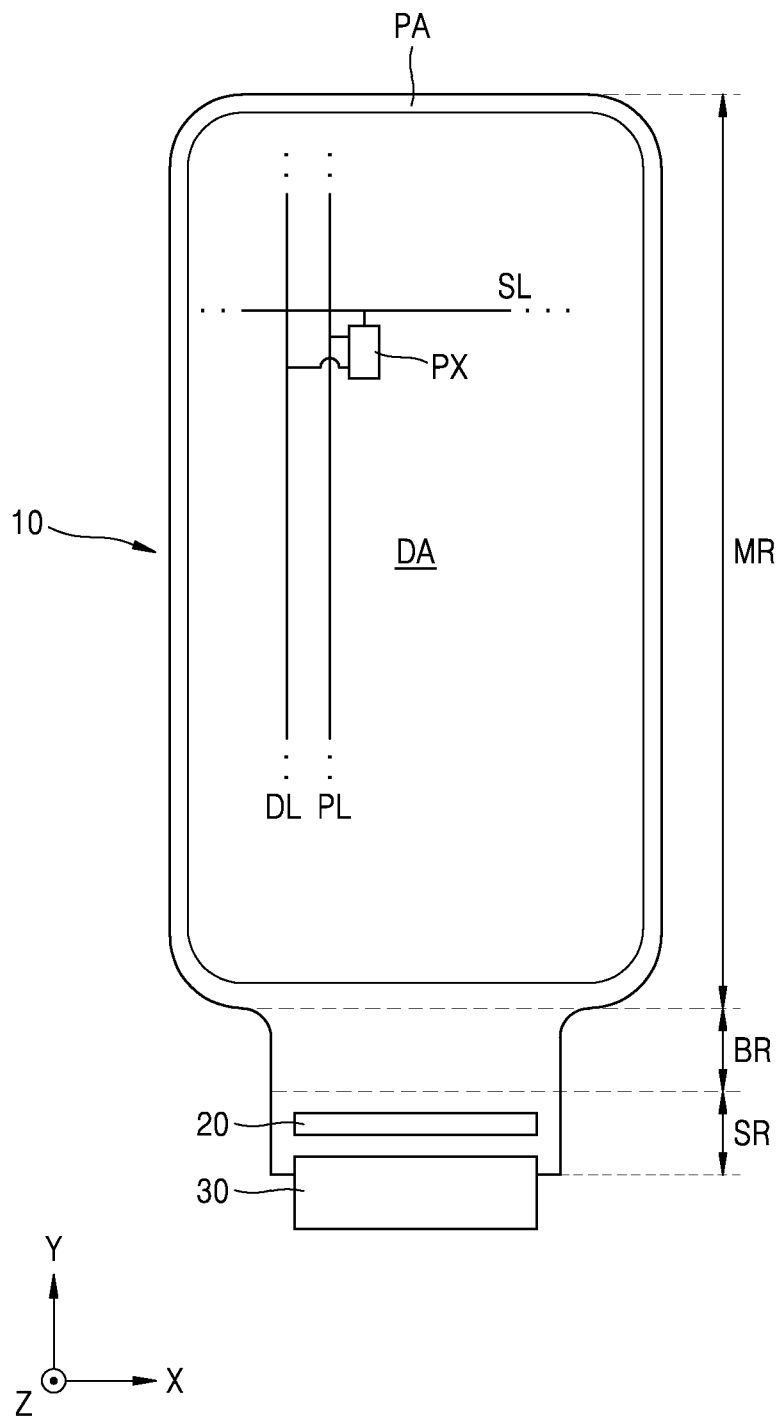
FIG. 1 is a plan view of a portion of a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present disclosure allows for various changes and numerous embodiments, certain embodiments will be illustrated in the drawings and described in the written description. Effects and features of the disclosure, and methods for achieving them will be clarified with reference to embodiments described below in detail with reference to the drawings. However, the disclosure is not limited to the following embodiments and may be embodied in various forms.

Hereinafter, embodiments will be described with reference to the accompanying drawings, wherein like reference numerals refer to like elements throughout and a repeated description thereof is omitted.

While such terms as "first" and "second" may be used to describe various components, such components must not be limited to the above terms. The above terms are used to distinguish one component from another.

The singular forms "a," "an," and "the" as used herein are intended to include the plural forms as well unless the context clearly indicates otherwise.

It will be understood that the terms "comprise," "comprising," "include" and/or "including" as used herein specify the presence of stated features or components but do not preclude the addition of one or more other features or components.

It will be further understood that, when a layer, region, or component is referred to as being "on" another layer, region, or component, it can be directly or indirectly on the other layer, region, or component. That is, for example, intervening layers, regions, or components may be present.

When an embodiment may be implemented differently, a certain process order may be performed differently from the described order. For example, two consecutively described processes may be performed substantially at the same time or performed in an order opposite to the described order.

In the present specification, "A and/or B" means A or B, or A and B. In the present specification, "at least one of A and B" means A or B, or A and B.

It will be understood that when a layer, region, or component is referred to as being "connected" to another layer, region, or component, it may be "directly connected" to the other layer, region, or component or may be "indirectly connected" to the other layer, region, or component with other layer, region, or component interposed therebetween. For example, it will be understood that when a layer, region, or component is referred to as being "electrically connected" to another layer, region, or component, it may be "directly electrically connected" to the other layer, region, or component or may be "indirectly electrically connected" to other layer, region, or component with other layer, region, or component interposed therebetween.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Figure 2:
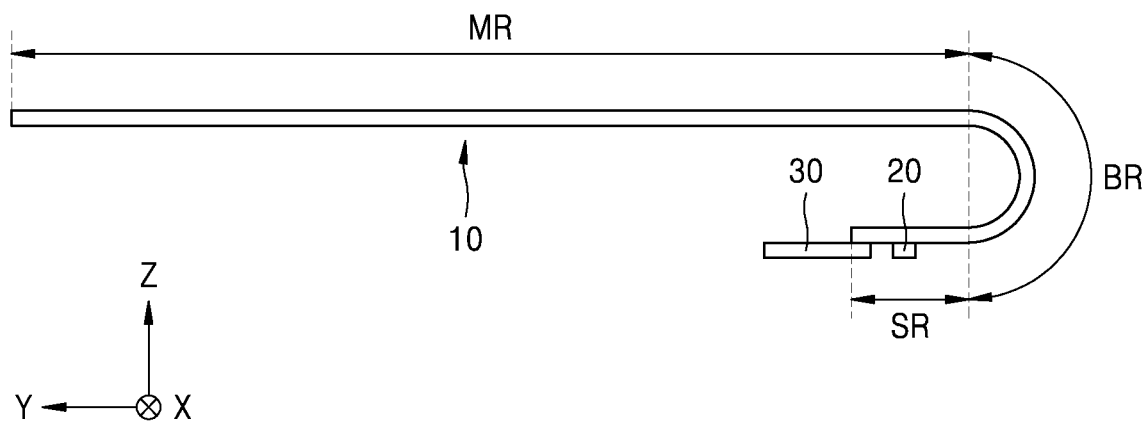
FIG. 2 is a side view of a display apparatus of FIG. 1.

FIG. 1 is a plan view of a portion of a display apparatus according to an embodiment, and FIG. 2 is a side view of the display apparatus of FIG. 1. For reference, FIG. 1 is a plan view of a portion of the display apparatus during a manufacturing process. The display apparatus may have a shape shown in FIG. 2 while the manufacturing process is performed.

Referring to FIGS. 1 and 2, the display apparatus according to an embodiment includes a display panel 10. As long as a display apparatus includes the display panel 10, any display apparatus may be used. As an example, the display apparatus may be various apparatuses such as smartphones, tablet computers, laptop computers, televisions, or advertisement boards.

The display panel 10 includes a display area DA and a peripheral area PA disposed outside of the display area DA. The display area DA may have various shapes such as a circular shape, an elliptical shape, a polygon, and a shape of a specific figure. It is shown in FIG. 1 that the display area DA has an approximately rectangular shape having round edges.

The display area DA is a portion configured to display an image. A plurality of pixels PX may be disposed in the display area DA. Each pixel PX may be a sub-pixel and may include a display element such as an organic light-emitting diode OLED. Each pixel PX may emit, for example, one of red, green, blue, and white light. A pixel PX may be electrically connected to a data line DL, a scan line SL, and a driving voltage line PL, the data line DL being configured to transfer a data signal, the scan line SL being configured to transfer a scan signal, and the driving voltage line PL being configured to supply a driving voltage.

Because the display panel 10 includes the substrate 100 (see FIG. 3), it may be considered that the substrate 100 has the display area DA and the peripheral area PA. Hereinafter, for convenience of description, the case where the substrate 100 includes the display area DA and the peripheral area PA is described.

In addition, the display panel 10 may include a main region MR, a bent region BR, and a sub-region SR, the bent region BR being disposed between the main region MR and the sub-region SR, and the sub-region SR being disposed opposite the main region MR with respect to the bent region BR. As shown in FIG. 2, bending of the display panel 10 may be performed in the bent region BR, and at least a portion of the sub-region SR may overlap the main region MR in a view in a z-direction (in a plan view). That is, FIG. 1 is a plan view before the bending is performed. The embodiment is not limited to a bent display apparatus and is applicable to a display apparatus that is not bent. The sub-region SR may be a non-display area. Because the display panel 10 is bent in the bent region BR, the non-display area may not be viewed or the area of the non-display area viewed from a direction (a-z direction) perpendicular to the main region MR may be reduced.

A driving chip 20 may be disposed in the sub-region SR of the display panel 10. The driving chip 20 may be electrically connected to an integrated circuit (e.g., a driver integrated circuit (IC)) that drives the display panel 10. Though the integrated circuit may be a data driving integrated circuit that generates a data signal, the embodiment is not limited thereto. When needed, the integrated circuit may be directly disposed in the sub-region SR of the display panel 10.

Though the driving chip 20 is disposed on the same surface of the substrate 100 as a display surface of the display area DA, because the display panel 10 is bent in the bent region BR as described above, the driving chip 20 may be disposed on the backside of the main region MR to overlap the main region MR.

A printed circuit board 30, etc. may be attached to the end of the sub-region SR of the display panel 10. The printed circuit board 30, etc. may be electrically connected to the driving chip 20, etc. through a pad (not shown) disposed on the substrate.

Hereinafter, an organic light-emitting display apparatus is described as an example of a display apparatus according to an embodiment. However, the display apparatus according to an embodiment is not limited thereto. As an example, the display apparatus according to an embodiment may be a display apparatus such as an inorganic light-emitting display or a quantum-dot light-emitting display. As an example, an emission layer of a display element of the display apparatus may include an organic material or an inorganic material. In addition, a quantum dot may be disposed on a path of light emitted from the emission layer.

Figure 3A:
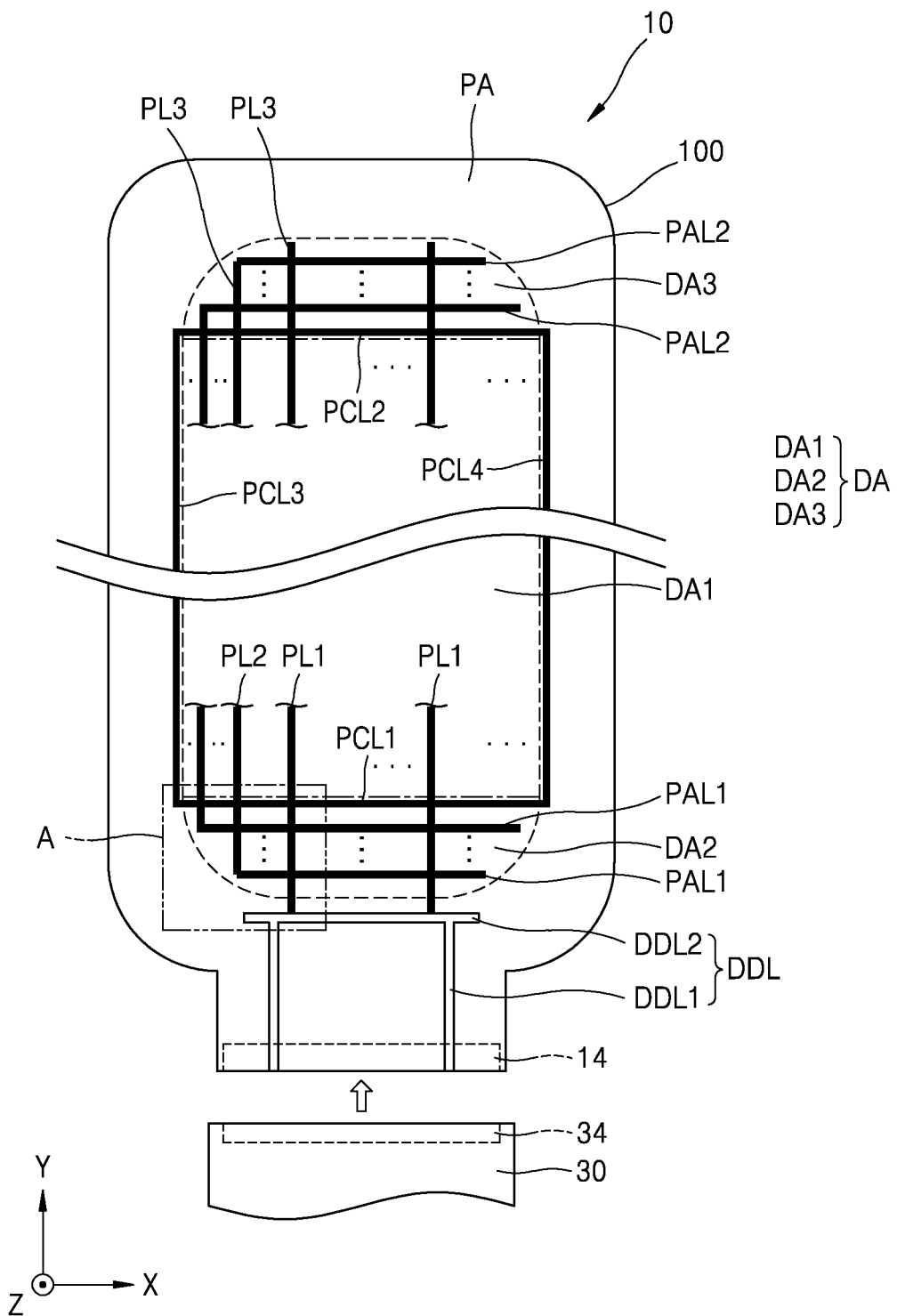
FIG. 3A is a plan view of a display panel of a display apparatus according to an embodiment.
Figure 3B:
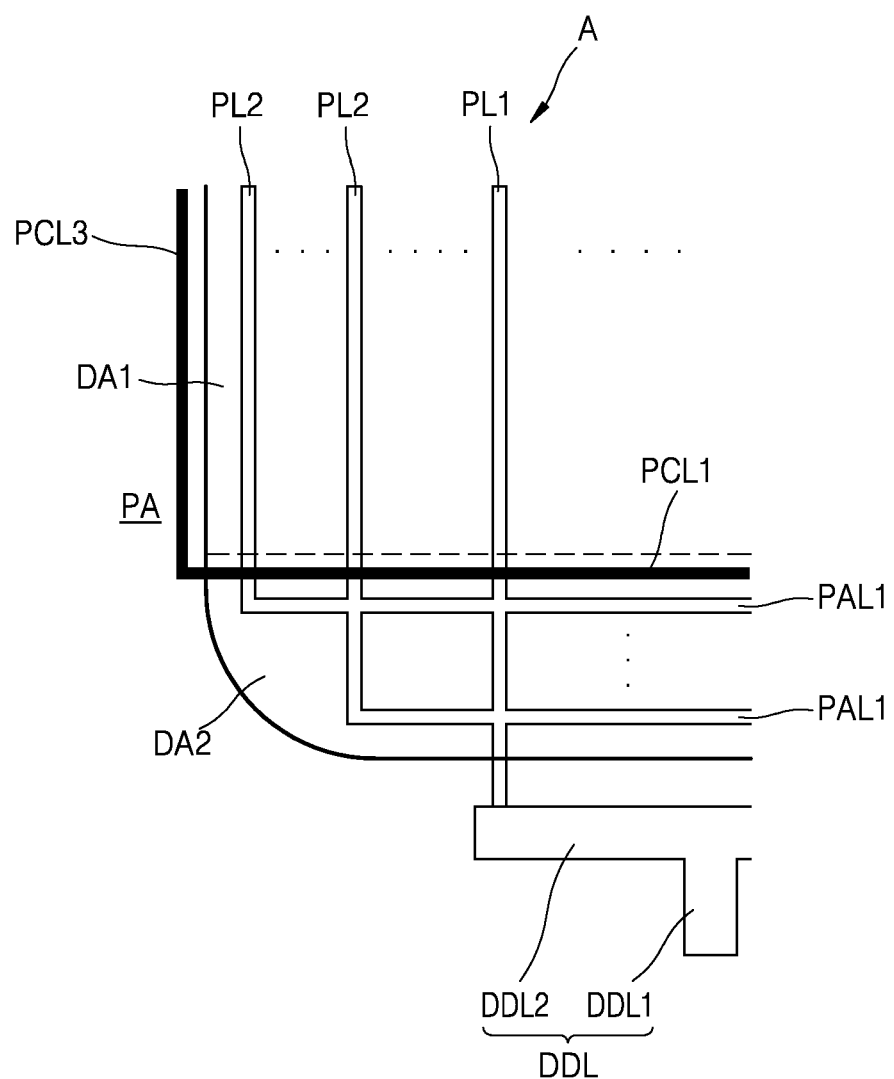
FIG. 3B is an enlarged plan view of a region A of FIG. 3A.

FIG. 3A is a plan view of a display panel of a display apparatus according to an embodiment, and FIG. 3B is an enlarged plan view of a region A of FIG. 3A.

Referring to FIGS. 3A and 3B, the display panel 10 according to an embodiment may include the substrate 100, a driving voltage supply line DDL, a plurality of first driving voltage lines PL1, a plurality of second driving voltage lines PL2, a plurality of third driving voltage lines PL3, a first driving voltage connection line PCL1, a second driving voltage connection line PCL2, a third driving voltage connection line PCL3, and a fourth driving voltage connection line PCL4.

The substrate 100 may include glass, metal, or a polymer resin. In the case where at least a portion of the display apparatus is bent or the display apparatus is flexible, the substrate 100 needs to be flexible or bendable. In this case, the substrate 100 may include a polymer resin such as polyethersulfone, polyacrylate, polyetherimide, polyethylene naphthalate, polyethylene terephthalate, polyphenylene sulfide, polyarylate, polyimide, polycarbonate, and cellulose acetate propionate. The substrate 100 may include two polymer resin layers and a barrier layer disposed between the two polymer resin layers and including an inorganic material (e.g. silicon oxide, silicon nitride, and silicon oxynitride). Various modifications may be made to the substrate 100. Furthermore, in the case where the substrate 100 is not bent, the substrate 100 may include glass, etc.

As described above, the substrate may include the display area DA and the peripheral area PA. The display area DA may include a first display area DA1, a second display area DA2, and a third display area DA3. The second display area DA2 is disposed on one side (in a −y direction) of the first display area DA1 and the third display area DA3 is disposed on another side of (in a +y direction) of the first display area DA1 which opposes the second display area DA2 with the first display area DA1 disposed between the second display area DA2 and the third display area DA3.

The driving voltage supply line DDL may be disposed in the peripheral area PA that is close to the second display area DA2. The driving voltage supply line DDL may include a first driving voltage supply line DDL1 and a second driving voltage supply line DDL2, the first driving voltage supply line DDL1 having a shape extending in a first direction (e.g., a y-axis direction), and the second driving voltage supply line DDL2 having a shape extending in a second direction (e.g., an x-axis direction) crossing the first direction. The driving voltage supply line DDL may be electrically connected to a pad portion 14 that may be disposed in the sub-region SR (see FIG. 1). The pad portion 14 may be exposed and electrically connected to the printed circuit board 30. A terminal 34 of the printed circuit board 30 may be electrically connected to the pad portion 14 of the display panel 10. The driving voltage supply line DDL may be provided with a driving voltage from a controller (not shown) through the terminal 34 and the pad portion 14 and may supply the driving voltage to each pixel PX (see FIG. 1) through a plurality of first driving voltage lines PL1 and a plurality of second driving voltage lines PL2.

The first driving voltage lines PL1 and the second driving voltage lines PL2 extending approximately parallel to each other may be disposed in the display area DA and may extend along the first direction (e.g., the y-axis direction). The first driving voltage lines PL1 may be electrically connected to the driving voltage supply line DDL and may contact the driving voltage supply line DDL in the peripheral area PA. The second driving voltage lines PL2 may be disposed between the first driving voltage line PL1 and the peripheral area PA. The second driving voltage lines PL2 may be electrically connected to the driving voltage supply line DDL via the first driving voltage line PL1. This is described below.

According to an embodiment, the first driving voltage lines PL1 and the second driving voltage lines PL2 may each extend along the first direction (e.g. the y-axis direction), may not extend to the third display area DA3, and may be disconnected in the first display area DA1. In this case, the third driving voltage lines PL3 may be disposed in the display area DA. The third driving voltage lines PL3 is electrically connected to the driving voltage supply line DDL through the second driving voltage connection line PCL2, the third driving voltage connection line PCL3, the first driving voltage connection line PCL1, and the first driving voltage line PL1. The third driving voltage lines PL3 may be disposed in the display area DA to cross the second driving voltage connection line PCL2. The third driving voltage line PL3 may extend along the first direction (e.g., the y-axis direction), extend from the third display area DA3 to the first display area DA1, and be disconnected in the first display area DA1 without extending to the second display area DA2. The third driving voltage line PL3 may not contact the first driving voltage lines PL1 and the second driving voltage lines PL2. With this arrangement, a component area in which components are disposed to overlap each other may be disposed in the central portion.

In addition, the third driving voltage lines PL3 may be symmetrical with the first driving voltage lines PL1 and the second driving voltage lines PL2 with respect to a line of symmetry which passes through a center of the first display area DA1 along the second direction (e.g., the x-axis direction).

However, the embodiment is not limited thereto. The driving voltage lines, that is, the first to third driving voltage lines PL1, PL2, and PL3 may be disposed in various shapes in the display area DA. As an example, the driving voltage lines, that is, the first to third driving voltage lines PL1, PL2, and PL3 may include a voltage line extending in the second direction (e.g., the x-axis direction) in the display area DA. That is, the driving voltage lines which include the first to third driving voltage lines PL1, PL2, and PL3 may be arranged in a mesh shape.

The first driving voltage connection line PCL1 may be disposed in the second display area DA2, and the second driving voltage connection line PCL2 may be disposed in the third display area DA3. The first driving voltage connection line PCL1 and the second driving voltage connection line PCL2 may each extend along the second direction (e.g., the x-axis direction). The first driving voltage connection line PCL1 and the second driving voltage connection line PCL2 may extend into the peripheral area PA. The first driving voltage connection line PCL1 may overlap a portion of the first driving voltage lines PL1 and the second driving voltage lines PL2 in the second display area DA2. The second driving voltage connection line PCL2 may overlap a portion of the third driving voltage lines PL3 in the third display area DA3. That is, the first driving voltage connection line PCL1 may contact the first driving voltage lines PL1 and the second driving voltage lines PL2 in the second display area DA2. The second driving voltage connection line PCL2 may contact the third driving voltage lines PL3 in the third display area DA3. In other words, the first driving voltage connection line PCL1 may cross the first driving voltage lines PL1 and the second driving voltage lines PL2 in the second display area DA2. The second driving voltage connection line PCL2 may cross the third driving voltage lines PL3 in the third display area DA3. Accordingly, the second driving voltage lines PL2 may be electrically connected to the driving voltage supply line DDL through the first driving voltage connection line PCL1 and the first driving voltage line PL1 that are electrically connected to each other.

The first driving voltage lines PL1, the second driving voltage lines PL2, the first driving voltage connection line PCL1, and the second driving voltage connection line PCL2 may be disposed on the same layer and may include the same material. In addition, the first driving voltage lines PL1, the second driving voltage lines PL2, the first driving voltage connection line PCL1, and the second driving voltage connection line PCL2 may be formed through the same process and may be integrally formed as a single body. The first driving voltage connection line PCL1 may be symmetrical with the second driving voltage connection line PCL2 with respect to the line of symmetry which passes through the center of the first display area DA1 along the second direction (e.g., the x-axis direction).

The third driving voltage connection line PCL3 and the fourth driving voltage connection line PCL4 may be disposed in the peripheral area PA and may connect end portions of each of the first driving voltage connection line PCL1 and the second driving voltage connection line PCL2, respectively. The third driving voltage connection line PCL3 and the fourth driving voltage connection line PCL4 may extend along the first direction (e.g., the y-axis direction). The third driving voltage connection line PCL3 and the fourth driving voltage connection line PCL4 may electrically connect the first driving voltage connection line PCL1 to the second driving voltage connection line PCL2. The third driving voltage connection line PCL3 may be symmetrical with the fourth driving voltage connection line PCL4 with respect to a line of symmetry which passes through a center of the first display area DA1 along the first direction (e.g., the y-axis direction).

A first additional connection line PAL1 may be disposed to be spaced apart from the first driving voltage connection line PCL1 and be disposed in the second display area DA2 to overlap a portion of each of the first driving voltage lines PL1. In other words, the first additional connection line PAL1 may be spaced apart from the first driving voltage connection line PCL1 and be disposed in the second display area DA2 to cross each of the first driving voltage lines PL1.

A second additional connection line PAL2 may be disposed to be spaced apart from the second driving voltage connection line PCL2 and be disposed in the third display area DA3 to overlap a portion of each of the first driving voltage lines PL1. In other words, the second additional connection line PAL2 may be spaced apart from the second driving voltage connection line PCL2 and be disposed in the third display area DA3 to cross each of the first driving voltage lines PL1. The first additional connection line PAL1 and the second additional connection line PAL2 may not extend to the peripheral area PA.

Though it is shown in FIG. 3A that two first additional connection lines PAL1 are disposed in the second display area DA2 and two second additional connection lines PAL2 are disposed in the third display area DA3, the embodiment is not limited thereto. As an example, one or three or more first additional connection lines PAL1 may be disposed in the second display area DA2 and one or three or more second additional connection lines PAL2 may be disposed in the third display area DA3. In the case where the plurality of first additional connection lines PAL1 and the plurality of second additional connection lines PAL2 are disposed, the plurality of first additional connection lines PAL1 and the plurality of second additional connection lines PAL2 may cross the first driving voltage lines PL1 and the second driving voltage lines PL2 to constitute an approximately mesh shape.

The first additional connection lines PAL1 may be symmetrical with the second additional connection lines PAL2 with respect to the line of symmetry which passed through the center of the display area DA1 along the first direction. As an example, in the case where the plurality of first additional connection lines PAL1 are disposed in the second display area DA2, and the plurality of second additional connection lines PAL2 are disposed in the third display area DA3, the plurality of first additional connection lines PALL the plurality of second additional connection lines PAL2, the first driving voltage lines PL1, the second driving voltage lines PL2 and the third driving voltage lines PL3 may constitute a mesh shape symmetrical with respect to the line of symmetry which passed through the center of the display area DA1 along the second direction DR2.

The first driving voltage lines PL1, the second driving voltage lines PL2, the third driving voltage lines PL3, the first driving voltage connection line PCL1, the second driving voltage connection line PCL2, the third driving voltage connection line PCL3, the fourth driving voltage connection line PCL4, the first additional connection lines PALL and the second additional connection lines PAL2 may be formed through the same process and may be integrally formed as a single body.

Figure 4A:
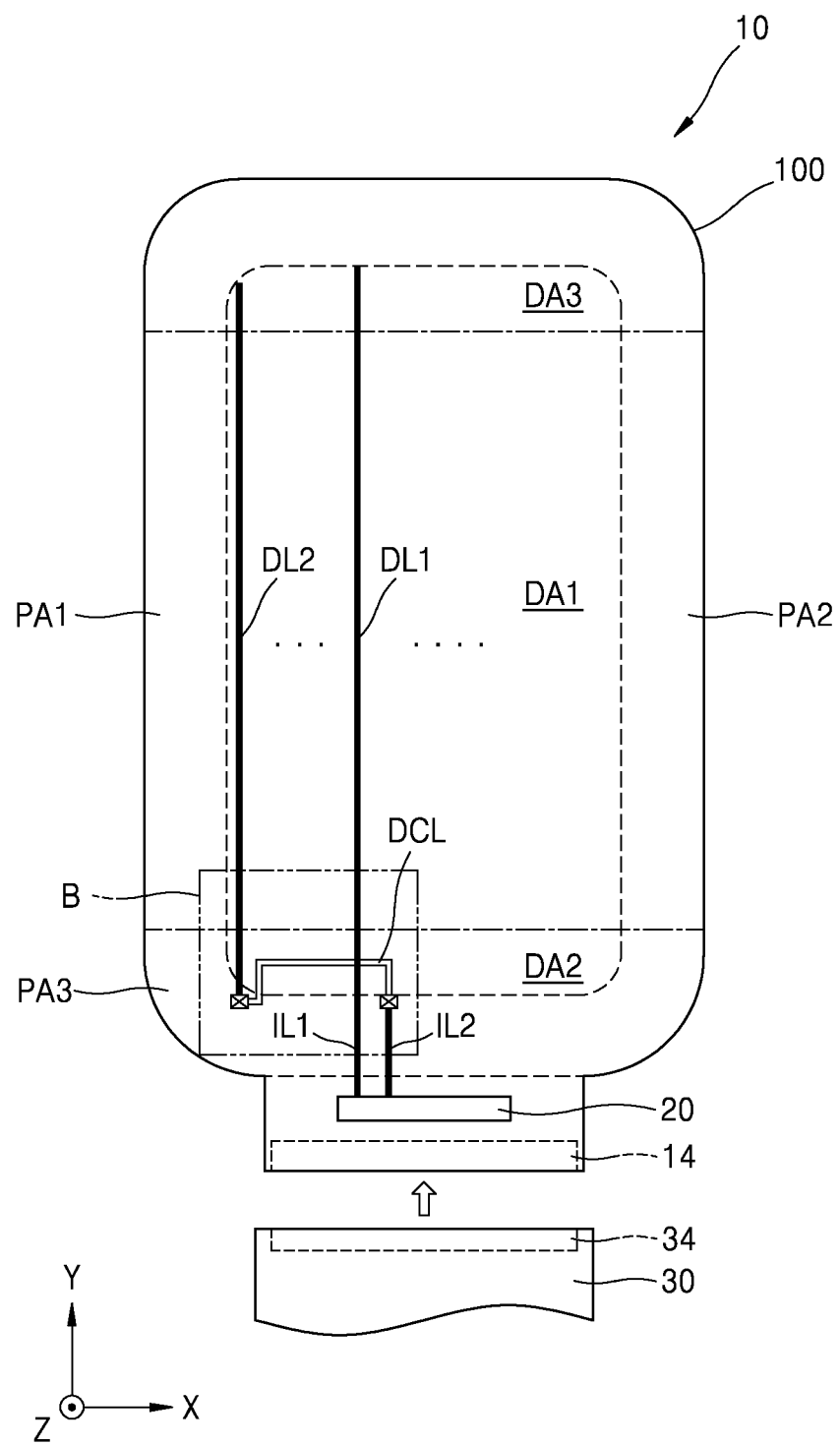
FIG. 4A is a plan view of a display panel of a display apparatus according to an embodiment.
Figure 4B:
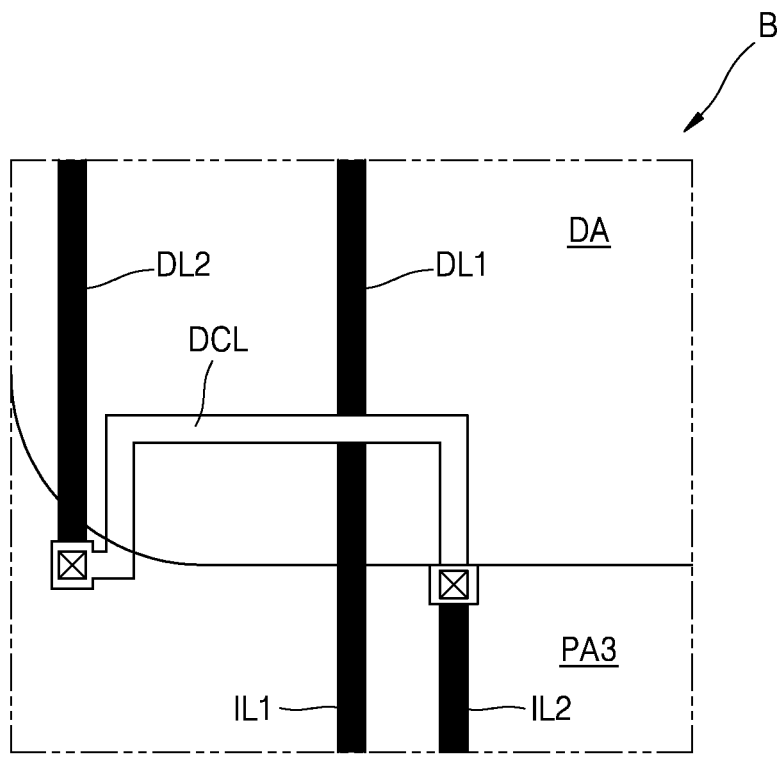
FIG. 4B is an enlarged plan view of a region B of FIG. 4A.

FIG. 4A is a plan view of a display panel of a display apparatus according to an embodiment, and FIG. 4B is an enlarged plan view of a region B of FIG. 4A.

Referring to FIGS. 4A and 4B, the peripheral area PA may include a first peripheral area PA1, a second peripheral area PA2, and a third peripheral area PA3. The first peripheral area PA1 may be disposed on one side of the display area DA along the second direction (e.g., the x-axis direction), and the second peripheral area PA2 may be disposed on another side of the display area DA which opposes the first peripheral area PA1 with the display area DA interposed between the first peripheral area PA1 and the second peripheral area PA2. The third peripheral area PA3 may be disposed on one side of the display area DA along the first direction (e.g., the −y direction) and may connect the first peripheral area PA1 to the second peripheral area PA2. That is, the third peripheral area PA3 may connect the first peripheral area PA1 to the second peripheral area PA2 and be disposed outside of the second display area DA2. Data lines, that is, first and second data lines, DL1 and DL2 may be disposed in the display area DA over the substrate 100, the first and second data lines DL1 and DL2 having a shape that extends along the first direction (e.g., the y-axis direction) and being disposed approximately parallel to each other. The first data line DL1 may be disposed close to a center of the display area DA. The second data line DL2 may be disposed between the first data line DL1 and the first peripheral area PA1. However, the embodiment is not limited thereto. As an example, a plurality of first data lines DL1 and a plurality of second data lines DL2 may be disposed in the display area DA. The plurality of second data lines DL2 may be disposed between the first peripheral area PA1 and the plurality of first data lines DL1, or between the second peripheral area PA2 and the plurality of first data lines DL1.

To input data signals to the data lines, that is, the plurality of first data lines DL1 and the plurality of second data lines DL2, input lines spaced apart from each other are disposed in the third peripheral area PA3. A first input line IL1 may be electrically connected to the first data line DL1, and a second input line IL2 may be electrically connected to the second data line DL2. The first data line DL1 may be integrally formed as a single body with the first input line IL1 The embodiment is not limited thereto. As an example, the first data line DL1 and the first input line IL1 may be disposed on different layers and electrically connected to each other through a contact hole in the boundary between the display area DA and the third peripheral area PA3, or in the third peripheral area PA3.

One end of a data connection line DCL may be electrically connected to the second data line DL2 in the third peripheral area PA3, and the other end of the data connection line DCL may be electrically connected to the second input line IL2 in the third peripheral area PA3. The data connection line DCL may be disposed on different plane from the first data line DL1 to cross the first data line DL1 and pass through the display area DA in a plan view without causing short circuit between the first data line DL1 and the second data line DL2. The embodiment is not limited thereto. As an example, one end of the data connection line DCL may be electrically connected to the second data line DL2 in the second display area DA2.

Figure 5:
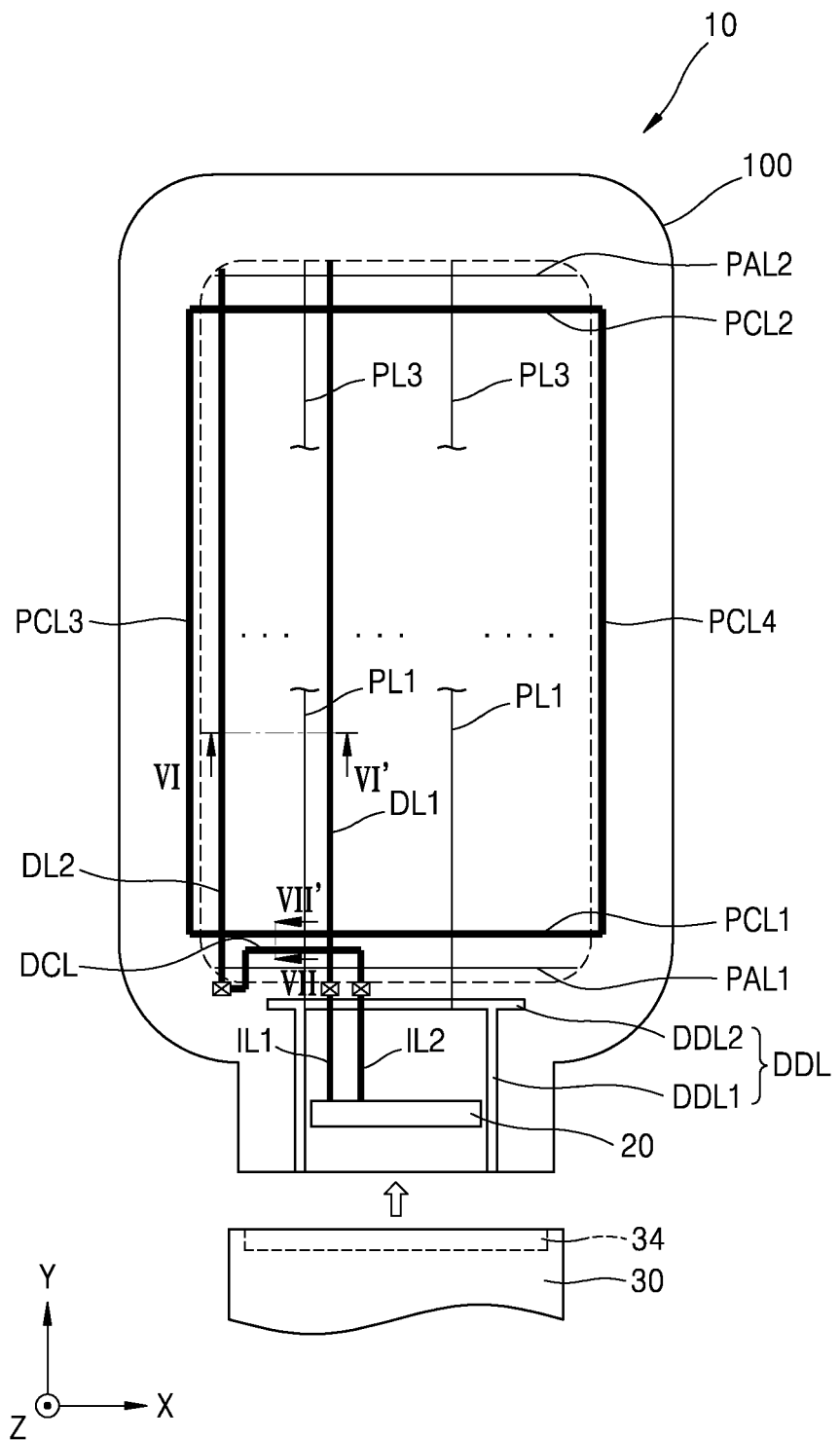
FIG. 5 is a plan view of a display panel of a display apparatus according to an embodiment.
Figure 6:
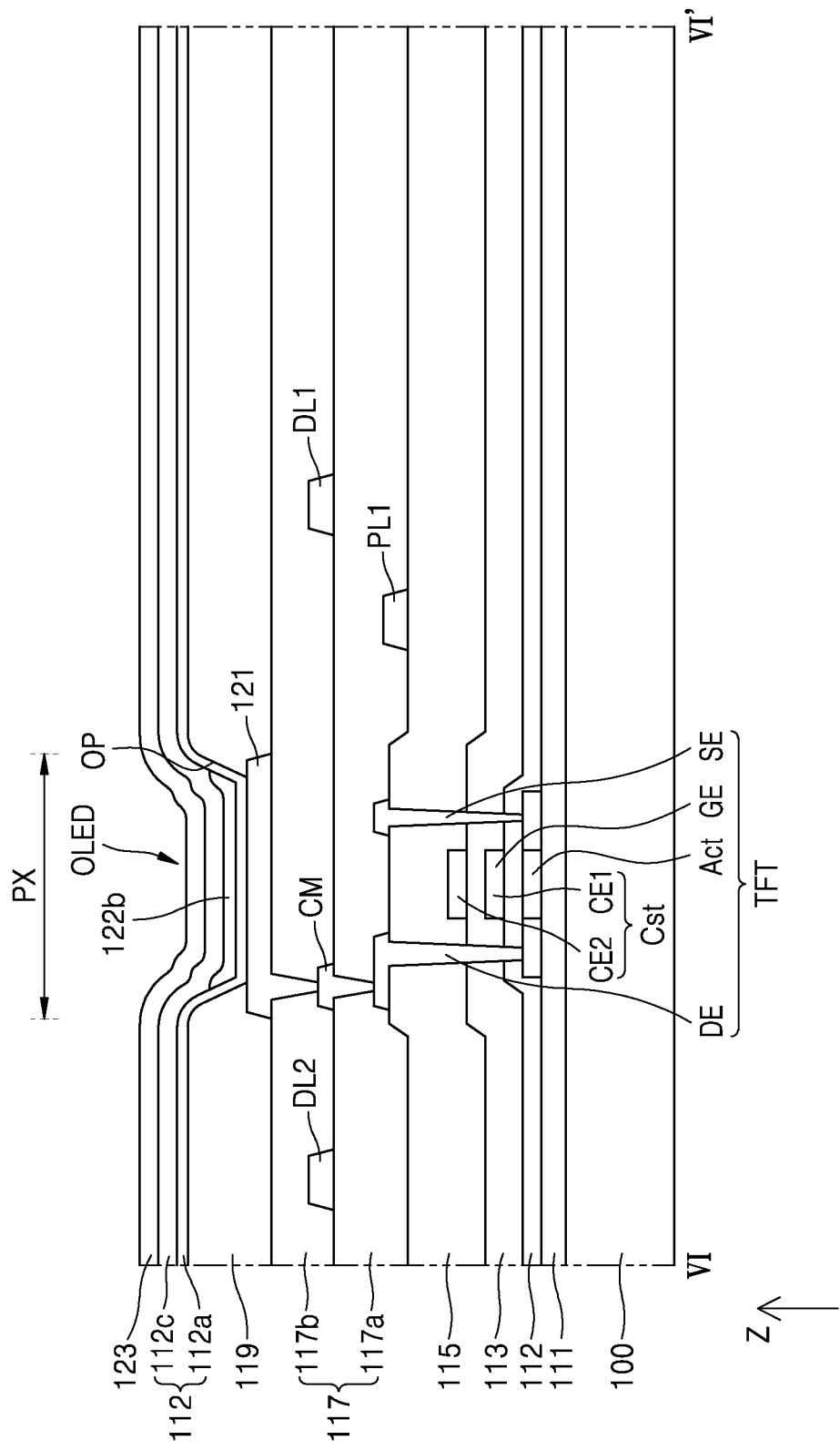
FIG. 6 is a cross-sectional view of the display panel taken along line VI-VI' of FIG. 5.
Figure 7:
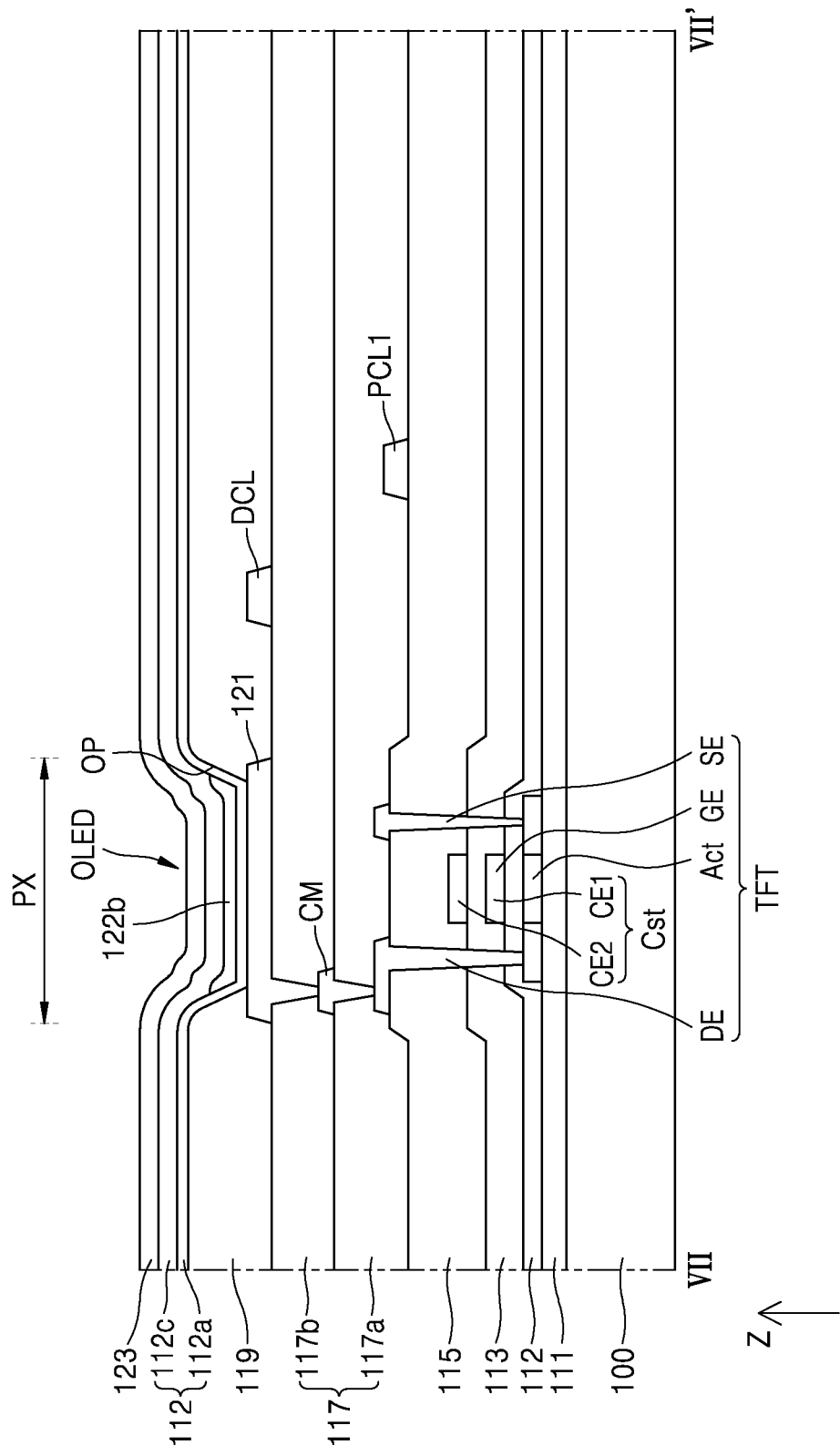
FIG. 7 is a cross-sectional view of the display panel taken along line VII-VII' of FIG. 5.

FIG. 5 is a plan view of a display panel of a display apparatus according to an embodiment, FIG. 6 is a cross-sectional view of the display panel, taken along line VI-VI' of FIG. 5, and FIG. 7 is a cross-sectional view of the display panel, taken along line VII-VII' of FIG. 5.

Referring to FIGS. 5 to 7, the display panel 10 may have a structure in which the substrate 100, a buffer layer 111, a first gate insulating layer 112, a second gate insulating layer 113, an interlayer insulating layer 115, a planarization layer 117, a pixel-defining layer 119, a functional layer 112, and an opposite electrode 123 are stacked.

The substrate 100 may include glass, metal, or a polymer resin. Because the substrate 100 has been described above, description thereof is omitted for convenience of description.

The buffer layer 111 may be disposed on the substrate 100, may reduce or block the penetration of foreign substance, moisture, or external air from below the substrate 100, and provide a flat surface on the substrate 100. The buffer layer 111 may include an inorganic material such as an oxide or a nitride, an organic material, or an organic/inorganic composite material, and have a single-layered structure or a multi-layered structure of an inorganic material and an organic material. A barrier layer (not shown) may be further disposed between the substrate 100 and the buffer layer 111, the barrier layer blocking the penetration of external air. The buffer layer 111 may include silicon oxide ($SiO_2$) or silicon nitride ($SiN_x$).

A thin-film transistor TFT may be disposed on the buffer layer 111. The thin-film transistor TFT may include a semiconductor layer Act, a gate electrode GE, a source electrode SE, and a drain electrode DE. The thin-film transistor TFT may be connected to an organic light-emitting diode OLED to drive the organic light-emitting diode OLED.

The semiconductor layer Act may be disposed on the buffer layer 111 and may include polycrystalline silicon. In another embodiment, the semiconductor layer Act may include amorphous silicon. In another embodiment, the semiconductor layer Act may include an oxide of at least one of indium (In), gallium (Ga), stannum (Sn), zirconium (Zr), vanadium (V), hafnium (Hf), cadmium (Cd), germanium (Ge), chromium (Cr), titanium (Ti), and zinc (Zn). The semiconductor layer Act may include a channel region, a source region, and a drain region, the source region and the drain region being doped with impurities.

The first gate insulating layer 112 may cover the semiconductor layer Act. The first gate insulating layer 112 may include an inorganic insulating material including silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide ($ZnO_2$). The first gate insulating layer 112 may include a single layer or a multi-layer including the above inorganic insulating material.

The gate electrode GE may be disposed on the first gate insulating layer 112 to overlap the semiconductor layer Act. The gate electrode GE may include at least one of molybdenum (Mo), aluminum (Al), copper (Cu), and titanium (Ti) and have a single-layered structure or a multi-layered structure. As an example, the gate electrode GE may have a multi-layered structure including molybdenum (Mo) and aluminum (Al).

The second gate insulating layer 113 may cover the gate electrode GE. The second gate insulating layer 113 may include an inorganic insulating material including silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide ($ZnO_2$). The second gate insulating layer 113 may have a single-layered structure or a multi-layered structure including the inorganic insulating material.

A top electrode CE2 of a storage capacitor Cst may be disposed on the second gate insulating layer 113. The top electrode CE2 of the storage capacitor Cst may overlap the gate electrode GE. In this case, the gate electrode GE may be a bottom electrode CE1 of the storage capacitor Cst. The top electrode CE2 and the bottom electrode CE1 may constitute the storage capacitor Cst. The top electrode CE2 may include aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), and/or copper (Cu) and have a single-layered structure or a multi-layered structure.

The interlayer insulating layer 115 may cover the top electrode CE2. The interlayer insulating layer 115 may include an inorganic insulating material including silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide ($ZnO_2$). The interlayer insulating layer 115 may have a single-layered structure or a multi-layered structure including the inorganic insulating material.

A source electrode SE and a drain electrode DE of the thin-film transistor TFT may be disposed on the interlayer insulating layer 115. The source electrode SE and the drain electrode DE may include a conductive material including molybdenum (Mo), aluminum (Al), copper (Cu), and titanium (Ti) and have a single-layered structure or a multi-layered structure including the above materials. As an example, the source electrode SE and the drain electrode DE may have a multi-layered structure of Ti/Al/Ti.

The planarization layer 117 may be disposed on the interlayer insulating layer 115 to cover the source electrode SE and the drain electrode DE. The planarization layer 117 may include an organic material or an inorganic material and have a single-layered structure or a multi-layered structure. The planarization layer 117 may include a first planarization layer 117a and a second planarization layer 117b. Accordingly, a conductive pattern such as a wiring may be formed between the first planarization layer 117a and the second planarization layer 117b, which may be advantageous in high integration. A connection electrode CM may be disposed on the first planarization layer 117a.

The planarization layer 117 may include a general-purpose polymer such as benzocyclobutene (BCB), polyimide, hexamethyldisiloxane (HMDSO), polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof. The planarization layer 117 may include an inorganic insulating material including silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), or zinc oxide ($ZnO_2$). After the planarization layer 117 is formed, chemical and mechanical polishing may be performed on the top surface of the planarization layer 117 to provide a flat top surface.

An organic light-emitting diode OLED may be disposed on the second planarization layer 117b. A pixel electrode 121 of the organic light-emitting diode OLED may be disposed on the second planarization layer 117b and electrically connected to the thin-film transistor TFT through the connection electrode CM.

The pixel electrode 121 may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). The pixel electrode 121 may include a reflective layer including silver (Ag), magnesium (Mg), aluminum (Al), platinum (Pt), palladium (Pd), gold (Au), nickel (Ni), neodymium (Nd), iridium (Ir), chrome (Cr), or a compound thereof. As an example, the pixel electrode 121 may have a structure including layers on/under the reflective layer, the layers including ITO, IZO, ZnO, or $In_2O_3$. As an example, the pixel electrode 121 may have a stacking structure of ITO/Ag/ITO.

The pixel-defining layer 119 may cover edges of the pixel electrode 121 on the planarization layer 117 and include an opening OP that exposes a central portion of the pixel electrode 121. An emission area of the organic light-emitting diode OLED, that is, the size and the shape of the pixel PX may be defined by the opening OP.

An emission layer 122b may be disposed in the opening OP of the pixel-defining layer 119 corresponding to the pixel electrode 121. The emission layer 122b may emit, for example, red, green, blue, or white light. A functional layer 112 may be disposed on and/or under the emission layer 122b. The functional layer 112 may include a first functional layer 112a and/or a second functional layer 112c.

The first functional layer 112a may be disposed under the emission layer 122b. The first functional layer 112a may include a hole injection layer (HIL) and/or a hole transport layer (HTL).

The second functional layer 122c may be disposed on the emission layer 122b. The second functional layer 122c may include an electron transport layer (ETL) and/or an electron injection layer (EIL).

An opposite electrode 123 may be disposed on the functional layer 112. The opposite electrode 123 may include a conductive material having a low work function. As an example, the opposite electrode 123 may include a (semi)transparent layer including silver (Ag), magnesium (Mg), aluminum (Al), platinum (Pt), palladium (Pd), gold (Au), nickel (Ni), neodymium (Nd), iridium (Ir), chrome (Cr), lithium (Li), calcium (Ca), or an alloy thereof. Layers from the pixel electrode 121 to the opposite electrode 123 may constitute the organic light-emitting diode OLED.

The first data line DL1 and the second data line DL2 may be disposed on the first planarization layer 117a and simultaneously formed through the same process. Accordingly, the first data line DL1 and the second data line DL2 may include the same material and include the same material as that of the connection electrode CM.

The first driving voltage line PL1 may be disposed on the interlayer insulating layer 115. The first driving voltage line PL1 may be disposed below the first data line DL1 and the second data line DL2 not to contact the data lines.

The data connection line DCL may be disposed on the second planarization layer 117b and may include the same material as that of the pixel electrode 121. The data connection line DCL may be disposed on a different layer not to contact the first data line DL1.

The first driving voltage connection line PCL1 may be disposed on the interlayer insulating layer 115. The first driving voltage connection line PCL1 may be disposed on the same layer as the first driving voltage line PL1 and may include the same material as that of the first driving voltage line PL1. In addition, the first driving voltage connection line PCL1 may be integrally formed as a single body with the first driving voltage line PL1.

The embodiment is not limited thereto. As an example, the first data line DL1 and the second data line DL2 may be disposed on the interlayer insulating layer 115. The first driving voltage line PL1 and the first driving voltage connection line PCL1 may be disposed on the first planarization layer 117a. The data connection line DCL may be disposed on a layer different from the interlayer insulating layer 115 and the first planarization layer 117a.

Figure 8:
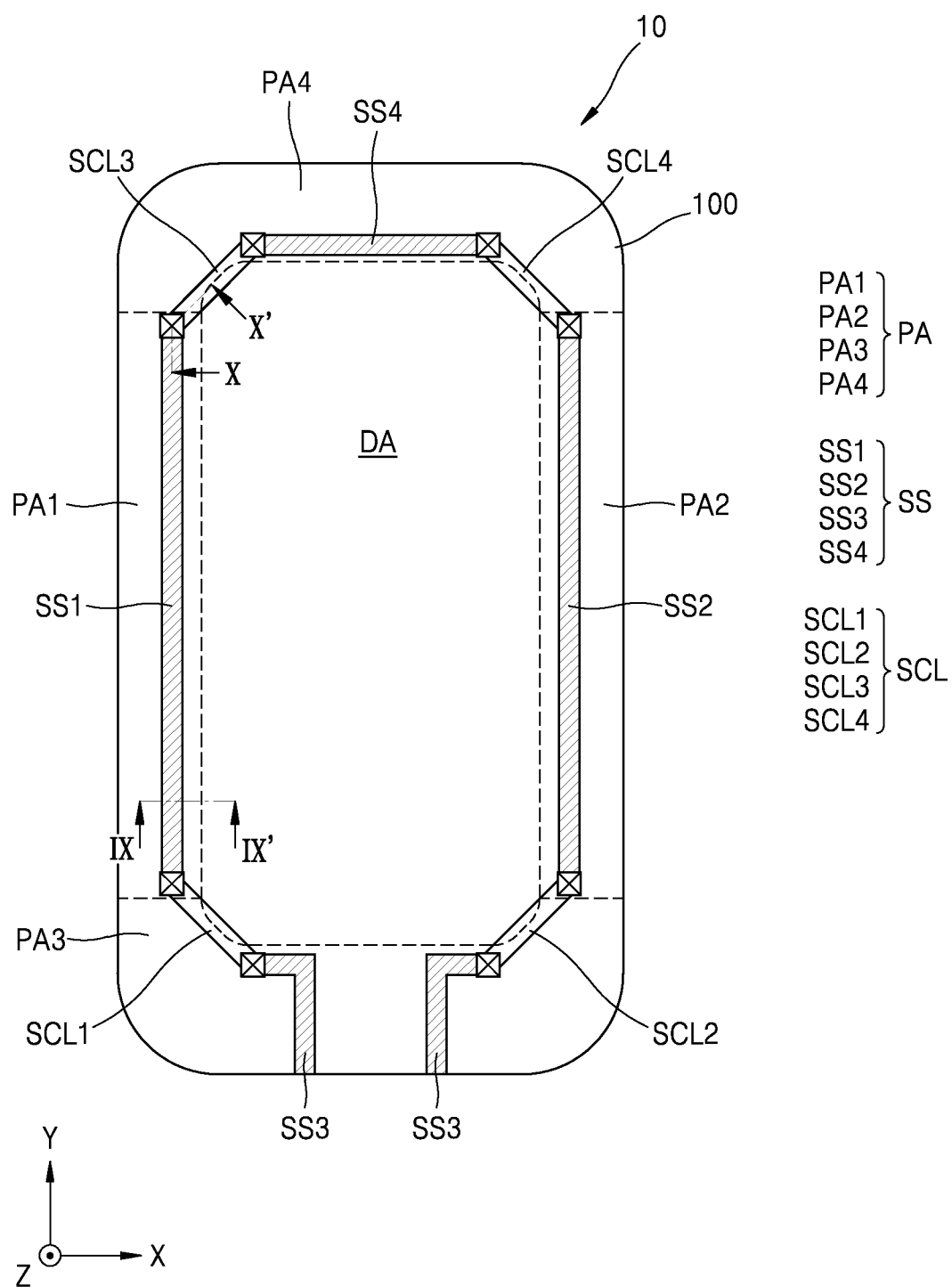
FIG. 8 is a plan view of a display panel of a display apparatus according to an embodiment.

FIG. 8 is a plan view of a display panel of a display apparatus according to an embodiment.

Referring to FIG. 8, the display panel 10 according to an embodiment may include a substrate including the display area DA and the peripheral area PA, a first common voltage supply line SS1, a second common voltage supply line SS2, a first third common voltage supply line SS3 disposed on one side of the display panel, a second third common voltage supply line SS3 disposed on the other side of the display panel with respect to a line of symmetry which passes through a center of the display area DA along a the first direction, a fourth common voltage supply line SS4 opposing the third common voltage supply line SS3 with respect to the display area DA disposed between the third common voltage supply line SS3 and the fourth common voltage supply line SS4, a first common voltage connection line SCL1, a second common voltage connection line SCL2, a third common voltage connection line SCL3, and a fourth common voltage connection line SCL4.

The peripheral area PA may include a first peripheral area PA1, a second peripheral area PA2, and a third peripheral area PA3, and a fourth peripheral area PA4. The first peripheral area PA1 may be disposed on one side of the display area DA along the second direction (e.g., the x-axis direction). The second peripheral area PA2 may be disposed on the other side of the display area DA which opposing the one side of the display area DA with the display area DA disposed between one side of the display area DA and the other side of the display area DA. The third peripheral area PA3 may be disposed on one side of the display area DA along the first direction (e.g., the y-axis direction) and may connect the first peripheral area PA1 to the second peripheral area PA2. The fourth peripheral area PA4 may oppose the third peripheral area PA3 with the display area DA disposed between the third peripheral area PA3 and the fourth peripheral area PA4 and may connect the first peripheral area PA1 to the second peripheral area PA2.

The first common voltage supply line SS1 may be disposed in the first peripheral area PA1. The second common voltage supply line SS2 may be disposed in the second peripheral area PA2. The first third common voltage supply line SS3 and the second third common voltage supply line SS3 may be disposed in the third peripheral area PA3. The fourth common voltage supply line SS4 may be disposed in the fourth peripheral area PA4.

The first common voltage supply line SS1 and the second common voltage supply line SS2 may extend along the y-axis direction and extend approximately parallel to the data lines, that is, the first and second data lines DL1 and DL2 (see FIG. 4A).

Each of the third common voltage supply lines SS3 may have a shape in which a portion extending in the x-axis direction and a portion extending in the y-axis direction are integrally formed as a single body. The third common voltage supply lines SS3 may be spaced apart from each other with respect to an imaginary line passing a center of the display area DA along the first direction (e.g., the y-axis direction) and substantially parallel to the first and second common voltage supply lines SS1 and SS2. The portion extending in the y-axis direction of the third common voltage supply line SS3 may receive a common voltage from a controller (not shown) to transfer the common voltage to the opposite electrode 123 (see FIG. 9).

The fourth common voltage supply line SS4 may extend along the x-axis direction and extend approximately perpendicular to the first common voltage supply line SS1 and the second common voltage supply line SS2.

A dead space of the display panel 10 may be reduced by not arranging the common voltage supply lines SS in the corner portion of the peripheral area PA as described above.

The first common voltage connection line SCL1 may electrically connect one end portion of the first common voltage supply line SS1 and one end portion of the first third common voltage supply line SS3 that are spaced apart from each other. In this case, the one end portion of the first common voltage supply line SS1 electrically connected to the first common voltage connection line SCL1 may be an end portion disposed close to the third peripheral area PA3. In addition, the one end portion of the first third common voltage supply line SS3 electrically connected to the first common voltage connection line SCL1 may be an end portion disposed close to the first peripheral area PA1.

The second common voltage connection line SCL2 may electrically connect one end portion of the second common voltage supply line SS2 and one end portion of the second third common voltage supply line SS3 that are spaced apart from each other. In this case, the one end portion of the second common voltage supply line SS2 electrically connected to the second common voltage connection line SCL2 may be an end portion disposed close to the third peripheral area PA3. In addition, the one end portion of the second third common voltage supply line SS3 electrically connected to the second common voltage connection line SCL2 may be an end portion disposed close to the second peripheral area PA2.

The third common voltage connection line SCL3 may electrically connect the other end portion of the first common voltage supply line SS1 and one end portion of the fourth common voltage supply line SS4 that are spaced apart from each other. In this case, the other end portion of the first common voltage supply line SS1 electrically connected to the third common voltage connection line SCL3 may be an end portion disposed close to the fourth peripheral area PA4. In addition, the one end portion of the fourth common voltage supply line SS4 connected to the third common voltage connection line SCL3 may be an end portion disposed close to the first peripheral area PA1.

The fourth common voltage connection line SCL4 may electrically connect the other end portion of the second common voltage supply line SS2 and the other end portion of the fourth common voltage supply line SS4 that are spaced apart from each other. In this case, the other end portion of the second common voltage supply line SS2 electrically connected to the fourth common voltage connection line SCL4 may be an end portion disposed close to the fourth peripheral area PA4. In addition, the other end portion of the fourth common voltage supply line SS4 connected to the fourth common voltage connection line SCL4 may be an end portion disposed close to the second peripheral area PA2.

A portion of each of the first common voltage connection line SCL1 to the fourth common voltage connection line SCL4 may overlap the display area DA in a plan view.

Figure 9:
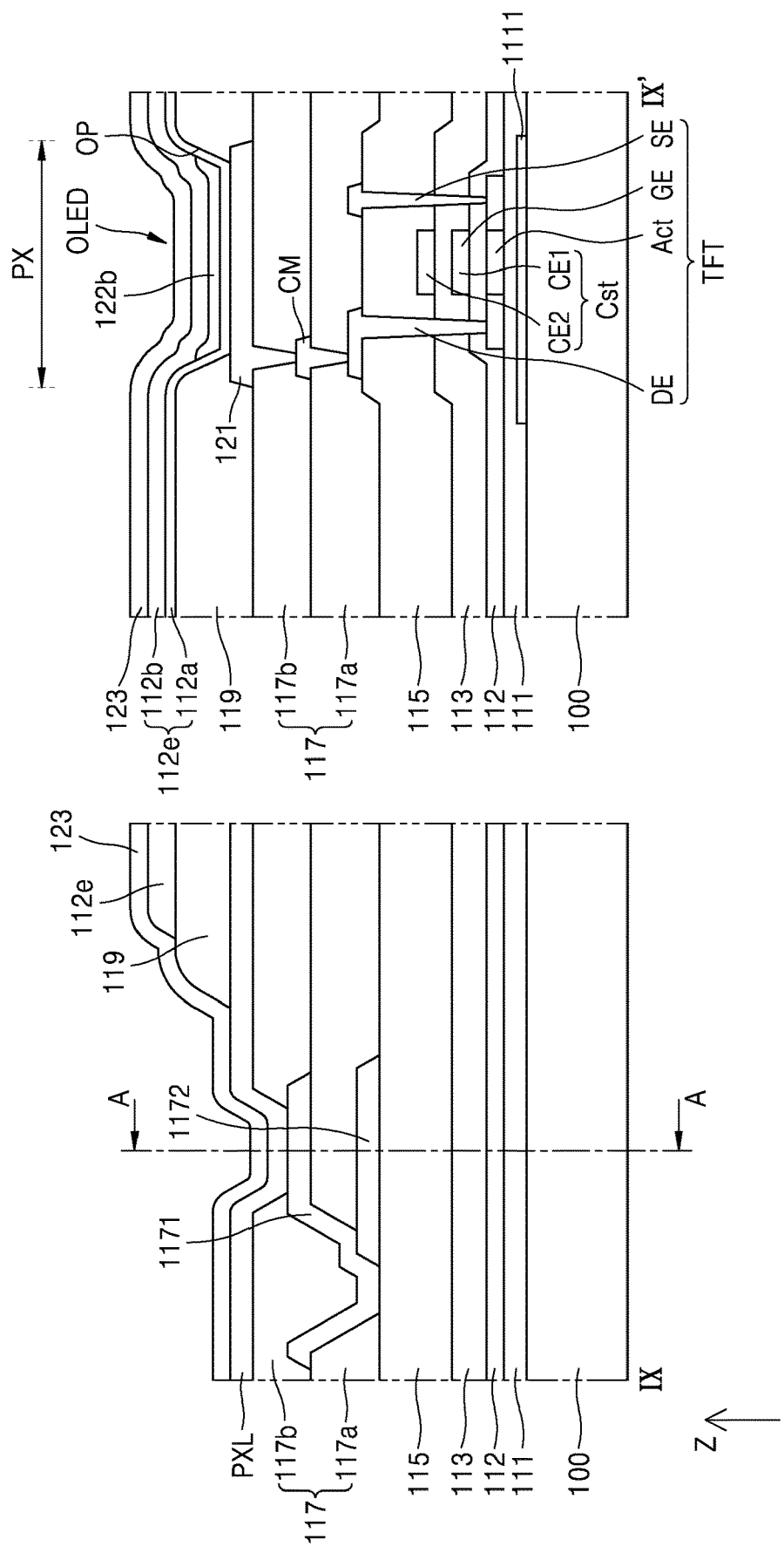
FIG. 9 is a cross-sectional view of the display panel taken along line IX-IX' of FIG. 8.
Figure 10:
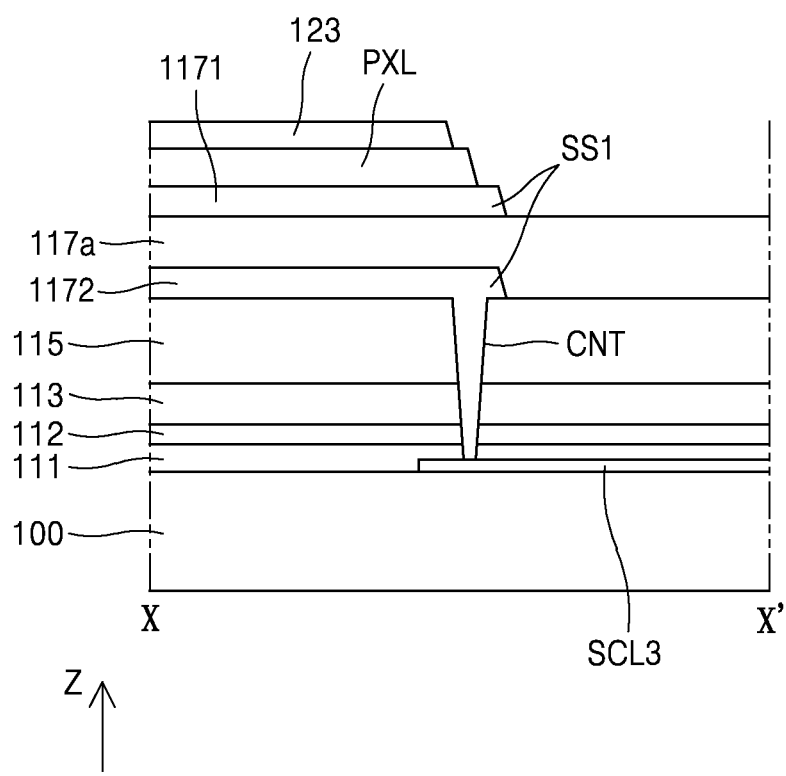
FIG. 10 is a cross-sectional view of the display panel taken along line X-X' of FIG. 8 or line A-A of FIG. 9.

FIG. 9 is a cross-sectional view of the display panel, taken along line IX-IX' of FIG. 8, and FIG. 10 is a cross-sectional view of the display panel, taken along line X-X' of FIG. 8 or line A-A of FIG. 9. In FIGS. 9 and 10, because the same reference numerals as those of FIG. 6 denote the same members, repeated descriptions thereof are omitted.

The thin-film transistor TFT may include an oxide semiconductor layer including an oxide semiconductor material. Because an oxide semiconductor has high carrier mobility and a low leakage current, a voltage drop is not large even after prolonged hours of use. That is, because a color change of an image resulted from a voltage drop is not large even though the thin-film transistor is driven in low frequencies, the thin-film transistor may be driven in low frequencies. Because the oxide semiconductor has an advantage of a low leakage current, the occurrence of a leakage current that may flow to the gate electrode GE of the thin-film transistor TFT may be prevented, and simultaneously, power consumption may be reduced. However, the oxide semiconductor is sensitive to light and leakage current may occur due to external light.

A shield layer 111 may be disposed between the substrate 100 and the semiconductor layer Act as shown in FIGS. 9 and 10. The shield layer 111 may absorb or reflect external light to prevent or reduce external light from being incident on a surface of an oxide semiconductor. For this purpose, when viewed from a direction approximately perpendicular to the top surface of the substrate 100 (i.e., in a plan view), the shield layer 111 may overlap the semiconductor layer Act.

The first common voltage supply line SS1 may include a first sub-voltage wiring 1171 and a second sub-voltage wiring 1172. The first sub-voltage wiring 1171 may be disposed on the first planarization layer 117a. The second sub-voltage wiring 1172 may be disposed on the interlayer insulating layer 115. The first sub-voltage wiring 1171 may include the same material as that of the connection electrode CM. The second sub-voltage wiring 1172 may include the source electrode SE and the drain electrode DE.

The first sub-voltage wiring 1171 may be electrically connected to the second sub-voltage wiring 1172. As an example, the first sub-voltage wiring 1171 may have a shape covering the end portion of the second sub-voltage wiring 1172 and may be electrically connected to the second sub-voltage wiring 1172. The second sub-voltage wiring 1172 may be electrically connected to the pad portion 14 (see FIG. 3A) to receive a common voltage. The common voltage may be applied to the opposite electrode 123 through the first sub-voltage wiring 1171 electrically connected to the second sub-voltage wiring 1172.

The second planarization layer 117b may be disposed on the first sub-voltage wiring 1171. The second planarization layer 117b may include an opening exposing the central portion of the first sub-voltage wiring 1171. An intermediate connection layer PXL may be disposed on the opening and the second planarization layer 117b. The intermediate connection layer PXL may be disposed on the same laser as the pixel electrode 121 and may include the same material as that of the pixel electrode 121.

The first common voltage supply line SS1 may be electrically connected to the second common voltage connection line SCL3 through a contact hole CNT, the second common voltage connection line SCL3 being disposed between the substrate 100 and the semiconductor layer Act. The second common voltage connection line SCL3 may be disposed on the same layer as the shield layer 111, simultaneously formed with the shield layer 111 through the same process, and may include the same material as that of the shield layer 111. The common voltage may be applied to the second sub-voltage wiring 1172 of the fourth common voltage supply line SS4 through the second sub-voltage wiring 1172 and the third common voltage connection line SCL3. Accordingly, the first common voltage supply line SS1 to the fourth common voltage supply line SS4 may have the same voltage.

Though FIGS. 9 and 10 describe the structure of only the first common voltage supply line SS1, the second common voltage supply line SS2 to the fourth common voltage supply line SS4 may have the same structure.

Figure 11A:
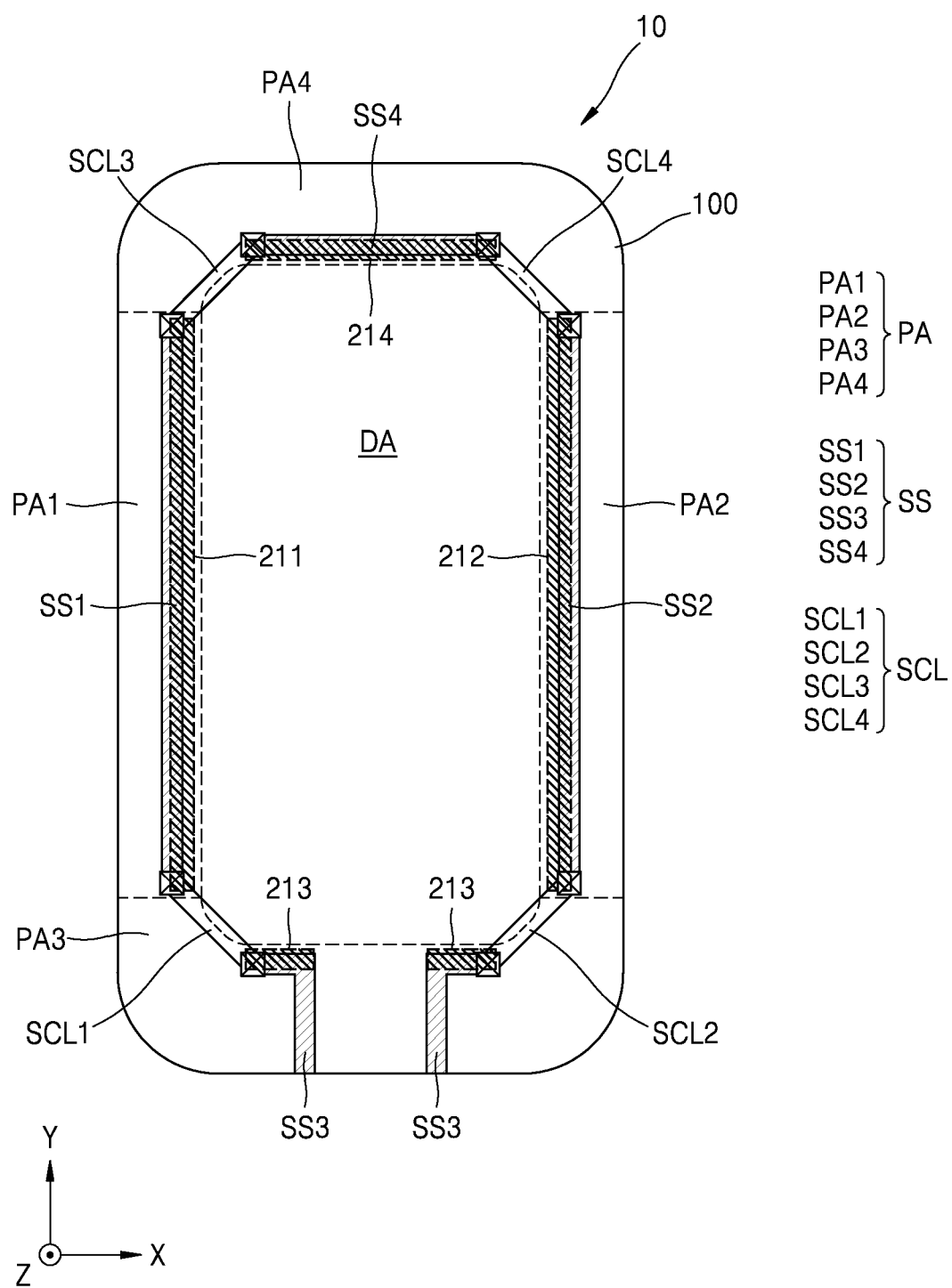
FIG. 11A is a plan view of a display panel of a display apparatus according to an embodiment.
Figure 11B:
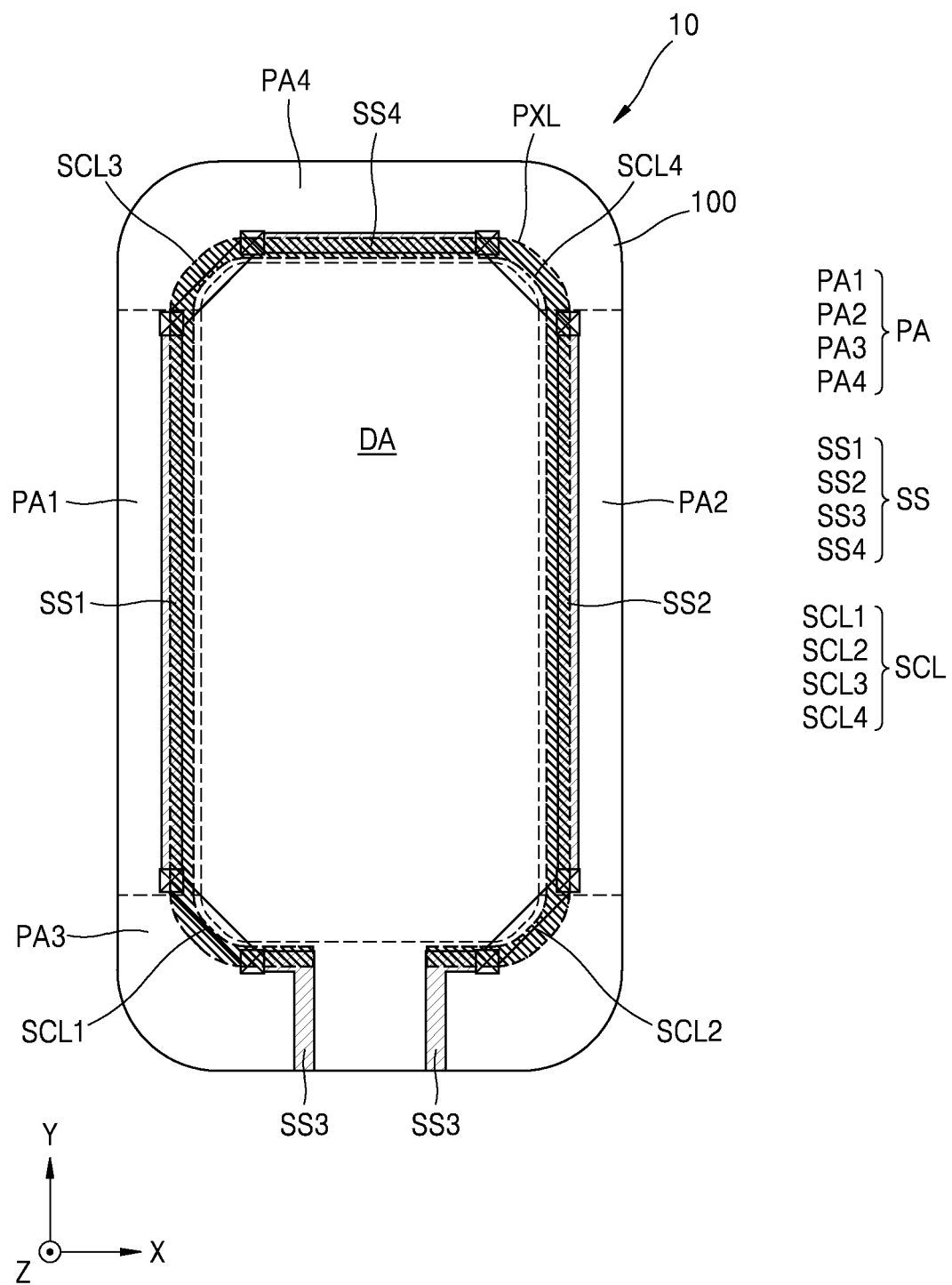
FIG. 11B is a plan view of a display panel of a display apparatus according to an embodiment.

FIGS. 11A and 11B are plan views of a display panel of a display apparatus according to an embodiment.

As described above in FIGS. 9 and 10, the intermediate connection layer PXL may be disposed between the common voltage supply line SS and the opposite electrode 123. FIGS. 11A and 11B shows the intermediate connection line PXL and the common voltage supply line SS when viewed from a direction of a z-axis.

The intermediate connection layer PXL according to an embodiment may include a first intermediate connection layer 211, a second intermediate connection layer 212, a first third intermediate connection layer 213, a second third intermediate connection layer 213 spaced apart from the first third intermediate connection layer 213 along a second direction (e.g., the x-axis direction), and a fourth intermediate connection layer 214 that are spaced apart from each other.

Referring to FIG. 11A, the first intermediate connection layer 211 may be disposed in the first peripheral area PA1. The intermediate connection layer PXL in FIG. 10 may be the first intermediate connection layer 211. The first intermediate connection layer 211 may extend along the first direction (e.g., the y-axis direction). The first intermediate connection layer 211 may overlap at least a portion of the first common voltage supply line SS1 in a view in the z-axis direction. The first intermediate connection layer 211 may be electrically connected to the first common voltage supply line SS1 and the opposite electrode 123.

The second intermediate connection layer 212 may be disposed in the second peripheral area PA2. The second intermediate connection layer 212 may extend along the first direction (e.g., the y-axis direction). The second intermediate connection layer 212 may overlap at least a portion of the second common voltage supply line SS2 in a view in the z-axis direction. The second intermediate connection layer 212 may be electrically connected to the second common voltage supply line SS2 and the opposite electrode 123.

The third intermediate connection layers 213 may be disposed in the third peripheral area PA3. Each of the third intermediate connection layers 213 may extend in the second direction (e.g. the x-axis direction) and the third intermediate connection layers 213 may be spaced apart from each other along the second direction (e.g. the x-axis direction). The first third intermediate connection layer 213 may overlap at least a portion of the first third common voltage supply line SS3 and second third intermediate connection layer 213 may overlap at least a portion of the second third common voltage supply line SS3 when viewed from the z-axis direction (i.e., in a plan view). In an embodiment, each of the third intermediate connection layers 213 may overlap a portion of the corresponding one of the third common voltage supply lines SS3 that extends along the second direction (e.g., the x-axis direction) when viewed from the z-axis direction. The third intermediate connection layers 213 may be electrically connected to the third common voltage supply lines SS3 and the opposite electrode 123.

The fourth intermediate connection layer 214 may be disposed in the fourth peripheral area PA4. The fourth intermediate connection layer 214 may extend along the second direction (e.g., the x-axis direction). The fourth intermediate connection layer 214 may overlap at least a portion of the fourth common voltage supply line SS4 in a view in the z-axis direction. The fourth intermediate connection layer 214 may be electrically connected to the fourth common voltage supply line SS4 and the opposite electrode 123.

The first intermediate connection layer 211, the second intermediate connection layer 212, the third intermediate connection layers 213, and the fourth intermediate connection layer 214 may each have the same layered-structure as the layered-structure of the pixel electrode 121. That is, the first intermediate connection layer 211 to the fourth intermediate connection layer 214 may each include silver (Ag), magnesium (Mg), aluminum (Al), platinum (Pt), palladium (Pd), gold (Au), nickel (Ni), neodymium (Nd), iridium (Ir), chrome (Cr), or a compound thereof. In the case where the pixel electrode 121 has a stacking structure of ITO/Ag/ITO, the first intermediate connection layer 211 to the fourth intermediate connection layer 214 also may have a stacking structure of ITO/Ag/ITO.

The intermediate connection layer PXL according to another embodiment may include a first end and a second end, the first end being disposed on one side of the third peripheral area PA3 and the second end being disposed on another side of the third peripheral area PA3. The intermediate connection layer PXL may extend through the first peripheral area PA1, the fourth peripheral area PA4, and the second peripheral area PA2.

Referring to FIG. 11B, the intermediate connection layer PXL may overlap at least a portion of the first common voltage supply line SS1 in the first peripheral area PA1, overlap at least a portion of the second common voltage supply line SS2 in the first peripheral area PA2, overlap at least a portion of the first third common voltage supply line SS3 in the third peripheral area PA3, overlap at least a portion of the second third common voltage supply line SS3 in the third peripheral area PA3, and overlap at least a portion of the fourth common voltage supply line SS4 in the fourth peripheral area PA4.

The intermediate connection layer PXL may have the same-layered structure as the layered-structure of the pixel electrode 121. That is, the intermediate connection layer PXL may include silver (Ag), magnesium (Mg), aluminum (Al), platinum (Pt), palladium (Pd), gold (Au), nickel (Ni), neodymium (Nd), iridium (Ir), chrome (Cr), or a compound thereof. In the case where the pixel electrode 121 has a stacking structure of ITO/Ag/ITO, the intermediate connection layer PXL also may have a stacking structure of ITO/Ag/ITO.

As described above, according to an embodiment, a display apparatus in which the area of a dead space is reduced may be implemented. However, the scope of the present disclosure is not limited by this effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:
1. A display apparatus comprising:
    a substrate including a display area and a peripheral area disposed outside of the display area, the display area including a first display area, a second display area, and a third display area, the second display area being disposed on one side of the first display area, and the third display area being disposed on another side of the first display area which opposes the one side of the first display area;
    a driving voltage supply line disposed in the peripheral area of the substrate;
    a plurality of first driving voltage lines disposed in the display area and electrically connected to the driving voltage supply line;
    a first driving voltage connection line disposed in the second display area of the substrate to cross each of the plurality of the first driving voltage lines and extending into the peripheral area;
    a second driving voltage connection line disposed in the third display area of the substrate and extending into the peripheral area; and
    a third driving voltage connection line disposed in the peripheral area of the substrate and electrically connecting the first driving voltage connection line to the second driving voltage connection line,
    wherein the peripheral area includes a first peripheral area, a second peripheral area, and a third peripheral area, the first peripheral area being disposed on one side of the first to third display areas, the second peripheral area being disposed on another side of the first to third display areas, and the third peripheral area connecting the first peripheral area to the second peripheral area and being disposed outside of the second display area, and
    wherein the display apparatus further includes:
    a first input line and a second input line disposed in the third peripheral area and disposed to be spaced apart from each other;
    a first data line extending from the third peripheral area into the display area and electrically connected to the first input line;
    a second data line extending from the third peripheral area into the display area; and
    a data connection line including one end electrically connected to the second data line in the third peripheral area and including the other end electrically connected to the second input line, the data connection line being disposed above or below the first data line to cross the first data line and pass through the display area in a plan view.

2. The display apparatus of claim 1, further comprising a fourth driving voltage connection line disposed in the peripheral area of the substrate to be symmetrical with the third driving voltage connection line with respect to a line of symmetry which passes through a center of the first display area along a first direction and electrically connecting the first driving voltage connection line to the second driving voltage connection line.

3. The display apparatus of claim 1, further comprising second driving voltage lines disposed in the display area and electrically connected to the driving voltage supply line through the first driving voltage connection line and the plurality of first driving voltage lines.

4. The display apparatus of claim 3, further comprising third driving voltage lines disposed in the display area to cross the second driving voltage connection line and electrically connected to the driving voltage supply line through the second driving voltage connection line, the third driving voltage connection line, the first driving voltage connection line, and the plurality of first driving voltage lines.

5. The display apparatus of claim 4, wherein the plurality of first driving voltage lines and the plurality of second driving voltage lines are symmetrical with the plurality of third driving voltage lines with respect to a line of symmetry which passes through a center of the first display area along a first direction.

6. The display apparatus of claim 1, further comprising a first additional connection line disposed to be spaced apart from the first driving voltage connection line and disposed in the second display area of the substrate to cross each of the plurality of first driving voltage lines.

7. The display apparatus of claim 6, further comprising a second additional connection line disposed to be spaced apart from the second driving voltage connection line and disposed in the third display area of the substrate to cross each of the plurality of third driving voltage lines.

8. The display apparatus of claim 7, wherein the first additional connection line is symmetrical with the second additional connection line with respect to a line of symmetry which passes through a center of the first display area along a second direction which is substantially perpendicular to the first direction.

9. The display apparatus of claim 7, wherein the first driving voltage connection line, the second driving voltage connection line, the third driving voltage connection line, the plurality of first driving voltage lines, the first additional connection line, and the second additional connection line are entirely formed as a single body.

10. The display apparatus of claim 1, wherein the second data line is disposed between the first data line and the first peripheral area.

11. The display apparatus of claim 1, wherein the plurality of first driving voltage lines, the first driving voltage connection line, and the second driving voltage connection line are disposed on a layer different from a layer on which the first data line and the second data line are disposed.

12. The display apparatus of claim 1, wherein the first data line and the second data line are disposed on a same layer.

13. The display apparatus of claim 1, wherein the data connection line is disposed on a layer different from a layer on which the plurality of first driving voltage lines, the first driving voltage connection line, and the second driving voltage connection line are disposed.

14. A display apparatus comprising:
a substrate including a display area, a first peripheral area, a second peripheral area, and a third peripheral area, the first peripheral area being disposed on one side of the display area, the second peripheral area being disposed on another side of the display area which opposes the first peripheral area with the display area disposed between the first peripheral area and the second peripheral area, and the third peripheral area connecting one end of the first peripheral area to one end of the second peripheral area;
a first common voltage supply line disposed in the first peripheral area;
a second common voltage supply line disposed in the second peripheral area;
a first third common voltage supply line and a second third common voltage supply line disposed in the third peripheral area and disposed to be spaced apart from each other;
a first common voltage connection line electrically connecting an end portion of the first common voltage supply line to an end portion of the first third common voltage supply line; and
a second common voltage connection line electrically connecting an end portion of the second common voltage supply line to an end portion of the second third common voltage supply line,
wherein the substrate further includes
a fourth peripheral area connecting the other end of the first peripheral area to the other end of the second peripheral area, and
wherein the display apparatus further includes:
a fourth common voltage supply line disposed in the fourth peripheral area;
a third common voltage connection line electrically connecting the other end portion of the first common voltage supply line to an end portion of the fourth common voltage supply line; and
a fourth common voltage connection line electrically connecting the other end portion of the second common voltage supply line to the other end portion of the fourth common voltage supply line.

15. The display apparatus of claim 14, wherein each of the first common voltage connection line and the second common voltage connection line has a portion overlapping the display area in a plan view.

16. The display apparatus of claim 14, wherein the first to third common voltage supply lines are disposed on a same layer.

17. The display apparatus of claim 14, wherein the first common voltage connection line and the second common voltage connection line are disposed below the first to third common voltage supply lines.

18. The display apparatus of claim 14, further comprising a thin-film transistor disposed in the display area and including a semiconductor layer,
wherein the first common voltage connection line and the second common voltage connection line are disposed between the substrate and the semiconductor layer.

19. The display apparatus of claim 18, further comprising a shield layer disposed between the substrate and the semiconductor layer to correspond to the thin-film transistor,
wherein the first common voltage connection line and the second common voltage connection line each include a same material as that of the shield layer.

20. The display apparatus of claim 14, wherein each of the third common voltage connection line and the fourth common voltage connection line has a portion overlapping the display area in a plan view.

21. The display apparatus of claim 14, wherein the first to fourth common voltage connection lines are disposed below the first to fourth common voltage supply lines.

22. The display apparatus of claim 14, further comprising a thin-film transistor disposed in the display area and including a semiconductor layer,
wherein the first to fourth common voltage connection lines are disposed between the substrate and the semiconductor layer.

23. The display apparatus of claim 14, further comprising:
a first intermediate connection layer disposed in the first peripheral area and overlapping at least a portion of the first common voltage supply line;
a second intermediate connection layer disposed in the second peripheral area and overlapping at least a portion of the second common voltage supply line;
a first third intermediate connection layer disposed in the third peripheral area and overlapping at least a portion of the first third common voltage supply line and a second third intermediate connection layer disposed in the third peripheral area and overlapping at least a portion of the second third common voltage supply line; and
a fourth intermediate connection layer disposed in the fourth peripheral area and overlapping at least a portion of the fourth common voltage supply line.

24. The display apparatus of claim 23, wherein the first intermediate connection layer is electrically connected to the first common voltage supply line, the second intermediate connection layer is electrically connected to the second common voltage supply line, the first third intermediate connection layer is electrically connected to the first third common voltage supply line, the second third intermediate connection layer is electrically connected to the second third common voltage supply line, and the fourth intermediate connection layer is electrically connected to the fourth common voltage supply line.

25. The display apparatus of claim 23, further comprising a pixel electrode disposed in the display area, wherein each of the first to fourth intermediate connection layers has a same layered-structure as a layered-structure of the pixel electrode.

26. The display apparatus of claim 14, further comprising an intermediate connection layer that overlaps at least a portion of the first common voltage supply line in the first peripheral area, overlaps at least a portion of the second common voltage supply line in the second peripheral area, overlaps at least a portion of the third common voltage supply lines in the third peripheral area, and overlaps at least a portion of the fourth common voltage supply line in the fourth peripheral area.

27. The display apparatus of claim 26, wherein the intermediate connection layer has a first end and a second end, the first end being disposed on one side of the third peripheral area, the second end being on another side of the third peripheral area, and the intermediate connection layer extends through the first peripheral area, the fourth peripheral area, and the second peripheral area.

28. The display apparatus of claim 26, further comprising a pixel electrode disposed in the display area, wherein the intermediate connection layer has a same layered-structure as a layered-structure of the pixel electrode.

* * * * *